US011256176B1

(12) United States Patent
Ho

(10) Patent No.: US 11,256,176 B1
(45) Date of Patent: Feb. 22, 2022

(54) LITHO-AWARE SOURCE SAMPLING AND RESAMPLING

(71) Applicant: TAIWAN SEMICONDUCTOR MANUFACTURING CO., LTD., Hsinchu (TW)

(72) Inventor: Kenneth Lik Kin Ho, Redwood City, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/193,254

(22) Filed: Mar. 5, 2021

(51) Int. Cl.
*G03F 7/20* (2006.01)

(52) U.S. Cl.
CPC ...... *G03F 7/70441* (2013.01); *G03F 7/70025* (2013.01)

(58) Field of Classification Search
CPC .. G03F 7/70441; G03F 7/70025; G03F 7/705; G03F 1/36
See application file for complete search history.

(56) References Cited

U.S. PATENT DOCUMENTS

| 2006/0009957 A1* | 1/2006 | Kohle | G03F 7/705 703/2 |
| 2017/0147734 A1* | 5/2017 | Rosenbluth | G03F 7/705 |
| 2020/0174380 A1* | 6/2020 | Huang | G06N 3/08 |

OTHER PUBLICATIONS

Xiaofei Wu et al., "Comparison of three TCC calculation algorithms for partially coherent imaging simulation," Proc. SPIE 7544, Sixth International Symposium on Precision Engineering Measurements and Instrumentation, 75440Z (Dec. 28, 2010); https://doi.org/10.1117/12.885227.

\* cited by examiner

*Primary Examiner* — Peter B Kim
(74) *Attorney, Agent, or Firm* — McDermott Will & Emery LLP

(57) ABSTRACT

A method includes determining a first transmission cross coefficient (TCC) operator of an optical system of a lithographic system based on an illumination source. The method includes sampling the illumination source by a first number of sampling points to produce a first discrete source and determining a second TCC operator based on the first discrete source. The method also includes determining an error between the first TCC operator and the second TCC operator. The method includes recursively adjusting the first number of sampling points to re-sample the illumination source and to re-determine the second TCC operator until the error is below a threshold level and a final discrete source and a final second TCC operator is determined.

20 Claims, 18 Drawing Sheets

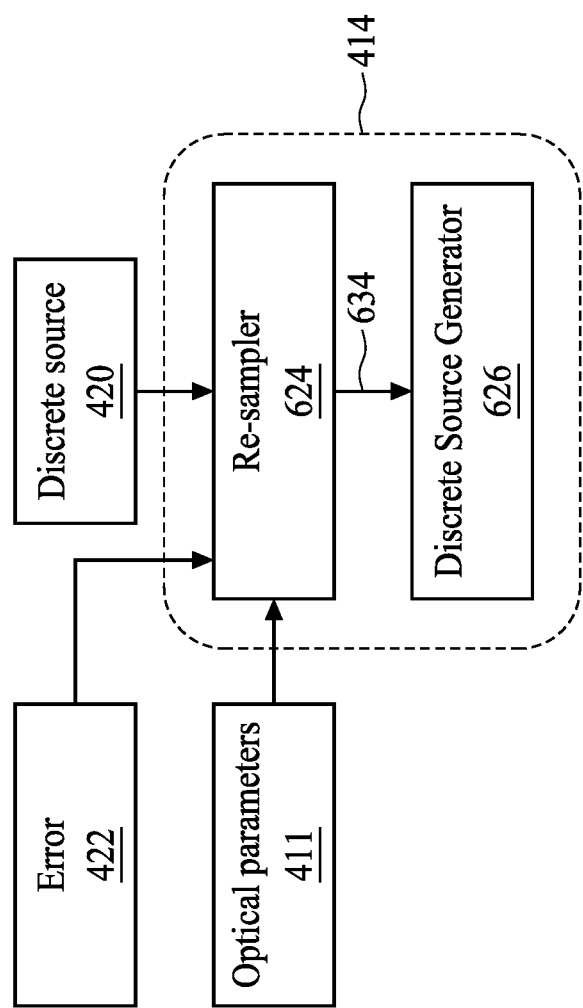

LITHO-AWARE SOURCE SAMPLING AND RESAMPLING

An optical lithography process transfers a layout pattern of a photo mask to the wafer such that etching, implantation, or other steps are applied only to predefined regions of the wafer. Transferring the layout pattern of the photo mask to the resist layer on the wafer may cause resist pattern defects that are a major challenge in semiconductor manufacturing. An optical proximity correction (OPC) operation may be applied to the layout pattern of the photo mask to reduce the resist pattern defects. The OPC may modify the layout patterns of the photo mask before the lithography process to compensate for the effect of the lithography process. In addition, inverse lithographic transformation (ILT) may be performed on the layout patterns of the photo mask to further compensate for the effect of the lithography process. An efficient OPC or ILT operation on the layout patterns of the photo masks is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 6B, and 6C illustrate schematic diagrams of exemplary systems for sampling and re-sampling an illumination source and generating a TCC operator.

DETAILED DESCRIPTION

Figure 1:
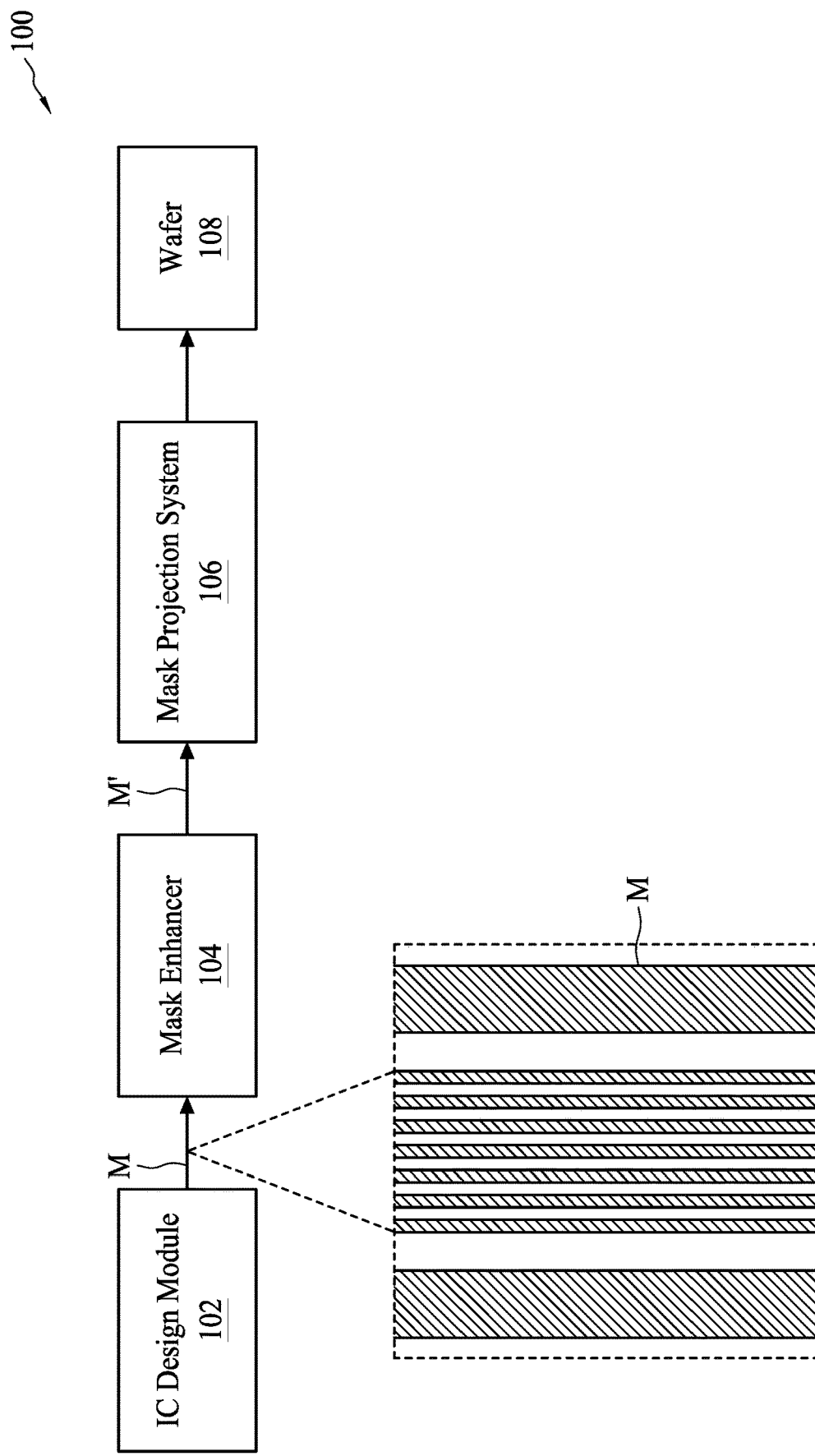
FIG. 1 illustrates a schematic diagram of an exemplary integrated circuit (IC) fabrication flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, one or both of the OPC operation or the ILT operation is applied to the layout pattern of the photo mask to reduce resist pattern defects. In some embodiments, both OPC and ILT operations are iteratively performed. The OPC and the ILT modify a layout pattern of the photo mask, the modified layout pattern of the photo mask is projected, by an optical system of a lithographic system, as a pattern on the resist material layer on a wafer. The projected pattern on the resist material is compared with a target layout pattern and an error between the projected pattern on the resist material and the target layout pattern in calculated. Depending on the calculated error and/or existence of some defects, e.g., a bridge or a narrowing, the layout pattern of the photo mask is further modified by the OPC and/or ILT operations. The iterative method is repeatedly applied until the defects are corrected and/or the calculated error is below a threshold level. In some embodiments, the projection of the layout pattern of the photo mask on the resist layer of a wafer is performed by a simulated projection and the projected pattern on the resist layer of the wafer is calculated. In the simulated projection, the illumination source, e.g., light source or laser source, of the optical system of the lithographic system is sampled by a sampling grid. A resolution of the sampling grid directly affects the complexity and accuracy of the simulated projection. If the illumination source sampling is performed with low resolution, the simulated projection may be fast but the simulated projection may lose accuracy. Conversely, if the illumination source sampling is performed with high resolution, the simulated projection may be slow and time consuming but the simulated projection may be more accurate. Thus, the resolution of the illumination source sampling defines the speed of the OPC and ILT operations and the accuracy of the OPC and ILT operations. Therefore, finding a suitable resolution for sampling the illumination source is desirable.

FIG. 1 illustrates a schematic diagram of an exemplary integrated circuit (IC) fabrication flow 100. The IC fabrication flow 100 begins with an IC design module 102 that provides layout patterns M, e.g., target layout patterns, that will be produced as a resist pattern of an IC product on the wafer. The IC design module 102 generates various layout shapes, e.g., geometrical patterns, based on the specification of the IC product for different steps of processing the IC product. In some embodiments, the layout patterns M are presented by one or more data files having the information of the geometrical patterns. In some embodiments, optically projecting the layout pattern of the photo mask to the wafer in the lithographic process degrades the layout pattern of the photo mask and generates pattern defects on the resist layer on the wafer. An optical proximity correction (OPC) operation may be applied to layout patterns of the photo mask to reduce the pattern defects on the wafer. The OPC may modify the layout patterns of the photo mask before the lithography process to compensate for the effect of the lithography and/or etching processes. The IC fabrication flow 100 also shows a mask enhancer 104. As will be described in more detail below with respect to FIG. 2A, the mask enhancer 104 performs the OPC in some embodiments. The mask enhancer 104 creates an OPCed (e.g., a corrected or enhanced) layout pattern M' on the photo mask. In some embodiments, the enhanced layout pattern M' is presented by one or more data files having the information of the enhanced geometrical patterns.

The IC fabrication flow 100 further shows a mask projection system 106. In some embodiments, the mask projection system 106 produces the enhanced layout patterns M' on the photo mask. In some embodiments, the mask projection system 106 performs two functions. As a first function, the mask projection system 106 uses the data files of the enhanced layout pattern M' and uses an electron beam to generate the enhanced layout pattern M' on a mask blank (not shown) to produce the photo mask for the ICs. In addition, and as a second function, the mask projection system 106 optically projects the enhanced layout pattern M' of the photo mask on the wafer 108 to produce the IC layouts on the wafer 108.

Figure 2A:
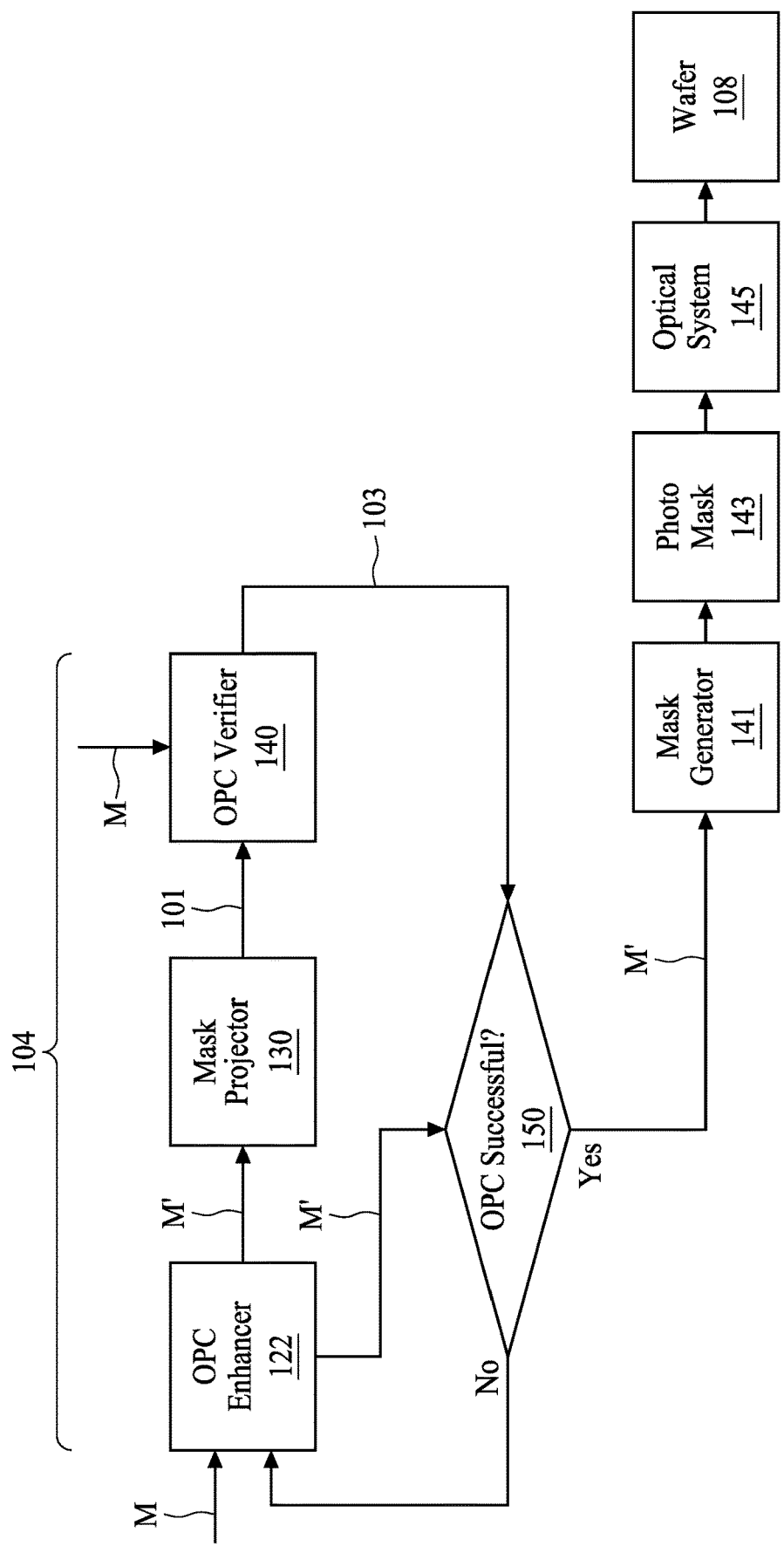
FIGS. 2A and 2B illustrate a schematic diagram of an exemplary photo mask enhancer and an OPC enhanced layout pattern associated with a target layout pattern.
Figure 2B:

FIGS. 2A and 2B illustrate a schematic diagram of an exemplary photo mask enhancer and an OPC enhanced layout pattern associated with a target layout pattern. FIG. 2A illustrates a schematic diagram of the mask enhancer 104 that receives the target layout pattern M at an input of an OPC enhancer 122 and produces the enhanced layout pattern M' at an output of the step 150. The mask enhancer 104 performs an iterative process. In some embodiments, the mask enhancer 104 includes an OPC enhancer 122 that receives, from the IC design module 102, the target layout pattern M that will be produced on the wafer 108. The OPC enhancer 122 performs enhancements on the target layout pattern M and produces the OPCed (e.g., the corrected or enhanced) layout pattern M'. As described, OPC is a lithography technique that is used to correct or enhance the layout pattern M and to add improved imaging effects to a target layout pattern M such that the OPCed layout pattern M' reproduces, on the wafer 108, the target layout pattern M. For example, OPC is used to compensate for imaging distortions due to optical diffraction. In some embodiments, the target layout pattern M is a data file having the information of the geometrical patterns to be produced on the wafer 108, and the OPC enhancer 122 modifies the data file and produces a corrected data file representing the enhanced layout pattern M'. In some embodiments, the target layout pattern M and the enhanced layout pattern M' are represented by the vertices of the layout patterns in the data files. Thus, in some embodiments, the rounded corners and the bends are represented by a curvilinear shape having multiple vertices and multiple line segments connecting the vertices and the curvilinear shape is represented by the multiple vertices in the data file.

FIG. 2A further shows a mask projector 130, e.g., a simulator for mask projection, that is applied to the enhanced layout pattern M' to produce a projected resist pattern 101 on the wafer. In some embodiments, the enhanced layout pattern M' is a data file and the mask projector 130 simulates the projection of the enhanced layout pattern M' on the wafer and produces the simulated projected resist pattern 101. The projected resist pattern 101 is inspected by an OPC verifier 140 for errors. In some embodiments, the OPC verifier 140 receives the target layout pattern M in addition to the projected resist pattern 101 and compares the projected resist pattern 101 with the target layout pattern M to find errors between target layout pattern M and the projected resist pattern 101. In some embodiments, the OPC verifier 140 verifies the enhanced, e.g., OPCed, layout pattern M' when the error between the target layout pattern M and the projected resist pattern 101 is below a threshold level and there are no defects, e.g., a bridge or narrowing shown in FIG. 3, in the projected resist pattern. In some embodiments, after verifying the enhanced layout pattern M', the OPC verifier 140 generates and sends a verification signal 103. In some embodiments, the OPC verifier 140 stores the enhanced layout pattern M' in a database. In some embodiments, instead of a simulated result, a photo resist pattern is formed by using a photo mask fabricated with the enhanced layout pattern M' and the shapes and dimensions of the resist patterns are measured and are fed back to the OPC enhancer. The mask projector 130 is described in more details with respect to FIGS. 7A and 7B.

The verification signal 103 is tested at step 150 and if the verification signal 103 is not successful, e.g., the error is above the threshold level or defects exist in the projected resist pattern 101, iterations continue by applying further OPC enhancements by the OPC enhancer 122. The iterations continue until the verification signal 103 is successful. When the verification signal 103 is successful, the enhanced layout pattern M' is provided as the output of the mask enhancer 104. In some embodiments, the error between the target layout pattern M and the projected resist pattern 101 is defined as a distance between the boundary of the target layout pattern M and a boundary of the projected resist pattern 101.

As shown, in addition to the mask enhancer 104, FIG. 2A includes a mask generator 141 and an optical system 145. In some embodiments, the enhanced layout pattern M' is sent as a data file to the mask generator 141. The mask generator 141 produces the enhanced layout pattern M' on a mask-blank to generate a photo mask 143. In some embodiments, the photo mask 143 is used by the optical system 145 of a photo lithography system to produce a resist pattern on a resist layer of the wafer 108.

FIG. 2B illustrates the target layout patterns 303 and the OPC enhanced, e.g., corrected, layout patterns 301 of a connection line. In some embodiments, the OPC enhanced layout patterns 301 of FIG. 2B is formed on a photo mask and the photo mask is projected onto a wafer, e.g., the wafer 108, by the mask projection system 106 of FIG. 1.

Figure 3:
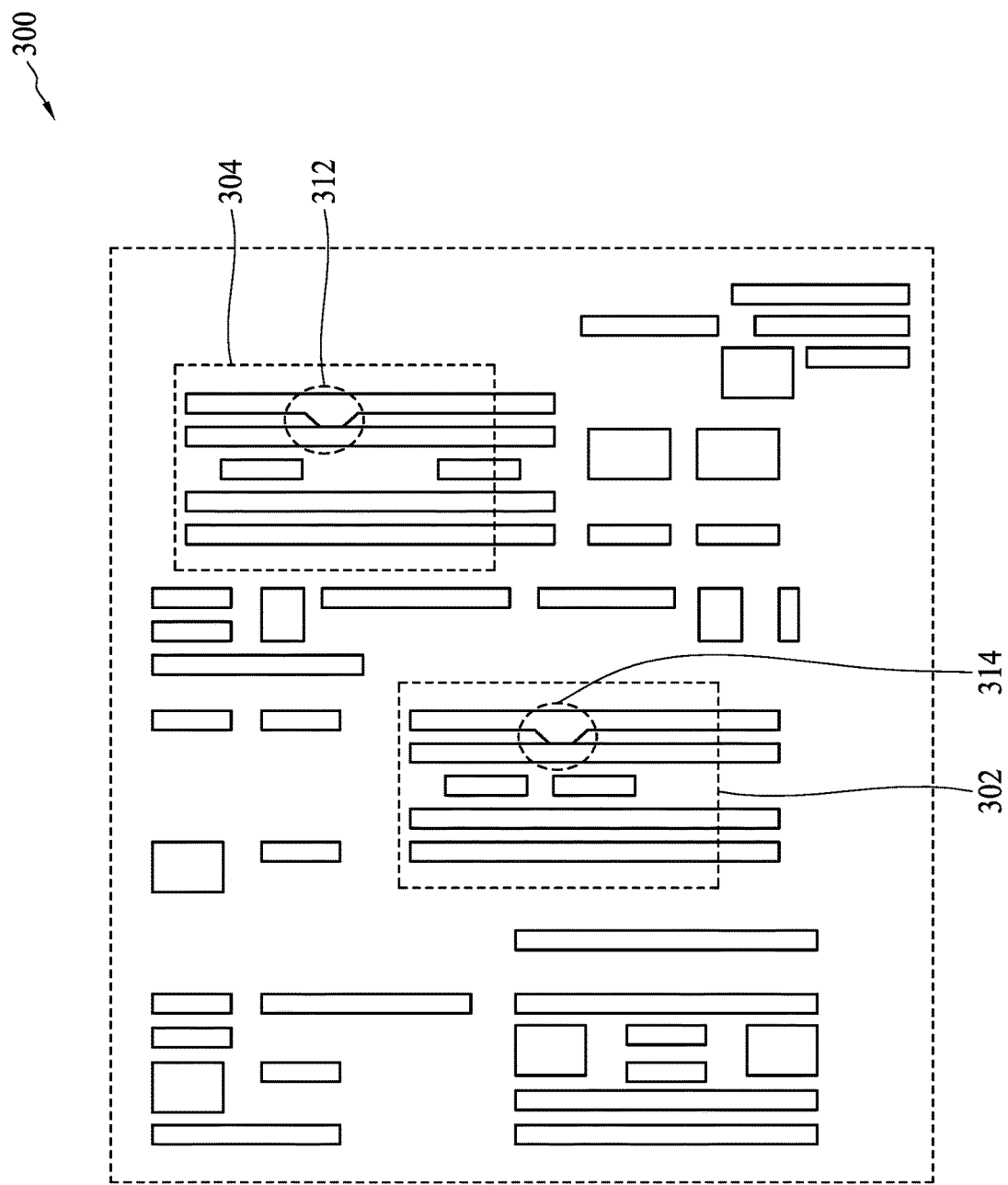
FIG. 3 illustrates exemplary layout contours having two defective areas.

FIG. 3 illustrates exemplary layout contours having two defective areas. FIG. 3 shows the resist pattern 300 having two defective areas 302 and 304. The resist pattern 300 may be produced by the mask projector 130 when the corrected mask layout M', after being OPCed, is projected on the resist layer of the wafer 108, disclosed herein. As shown, both of the defective areas 302, 304 respectively include a bridging 312 and a bridging 314 (e.g., short circuits) that are connections between adjacent layout lines in the middle of the defective areas 302 and 304. In some embodiments, the defective areas 302 and 304 are back projected to two corresponding hotspot regions in the corrected mask layout M'. In some embodiments, the ILT operation is performed on the corrected mask layout M', e.g., on the hotspot regions in the corrected mask layout M', to correct the corresponding defective areas 302 and 304 of the resist pattern produced in the resist layer of the wafer 108.

Figure 4:
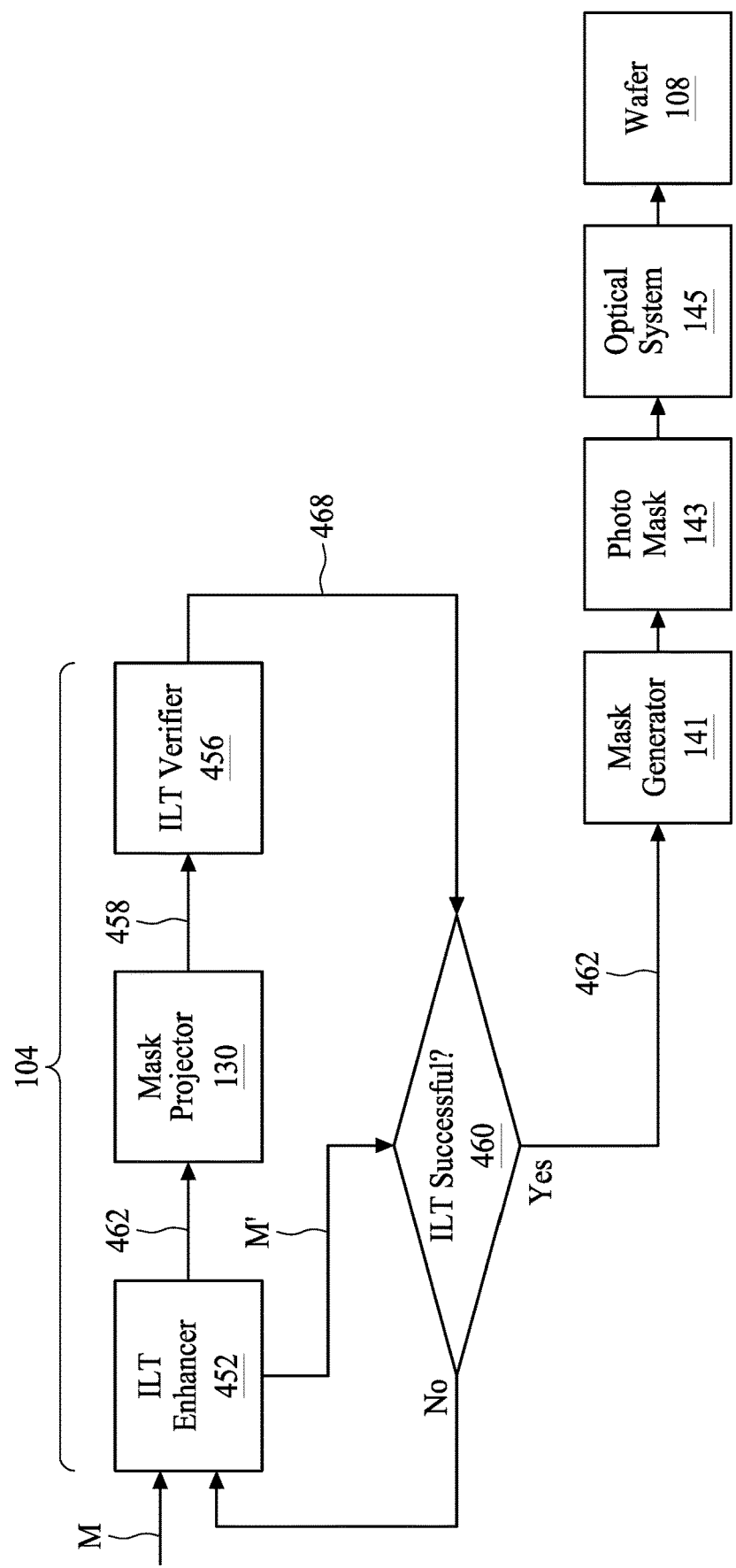
FIG. 4 illustrates a schematic diagram of an exemplary layout corrector.

FIG. 4 illustrates a schematic diagram of an exemplary layout corrector. FIG. 4 is configured to perform an ILT enhancement. FIG. 4 shows the mask enhancer 104 that receives the target layout pattern M at an input of an ILT enhancer 452 and produces an enhanced mask layout 462 at an output of the step 460. In some embodiments, the ILT enhancer 452 receives the corrected mask layout M' after the OPC operation. Either the corrected mask layout M' or the target layout pattern M includes a hotspot region corresponding to a defect on the resist layer when the corrected mask layout M' or the target layout pattern M is projected on the resist layer of the wafer 108.

The ILT enhancer 452 performs an enhancement, e.g., a constrained inverse filtering operation, on the hotspot region of the corrected mask layout M' or the target layout pattern M and produces the iteration result, the enhanced mask layout 462. The enhanced mask layout 462 is projected by the mask projector 130 on the resist layer of the wafer 108 to create a projected resist pattern 458. In some embodiments, the mask projector 130 performs a simulated projection and is consistent with the operation performed by the configuration of FIG. 7A. The projected resist pattern 458 is inspected by an ILT verifier 456 for defective areas. A verification outcome 468 is tested at step 460 and if the verification outcome 468 is not successful, e.g., defective areas exist, the iterations continue by modifying the layout enhancement at the ILT enhancer 452. The iterations continue until the verification outcome 468 is successful and the projected resist pattern 458 does not have any defective areas. When the verification outcome 468 is successful, the enhanced mask layout 462 is provided at step 460.

As shown, in addition to the mask enhancer 104, FIG. 4 includes the mask generator 141 and an optical system 145. A described above, the mask generator 141 generates the photo mask 143 from the enhanced mask layout 462 and the optical system 145 of the photo lithography system projects the photo mask 143 and produces the resist pattern on the resist layer of the wafer 108. The mask projector 130 is described in more details with respect to FIGS. 7A and 7B.

Figure 5:
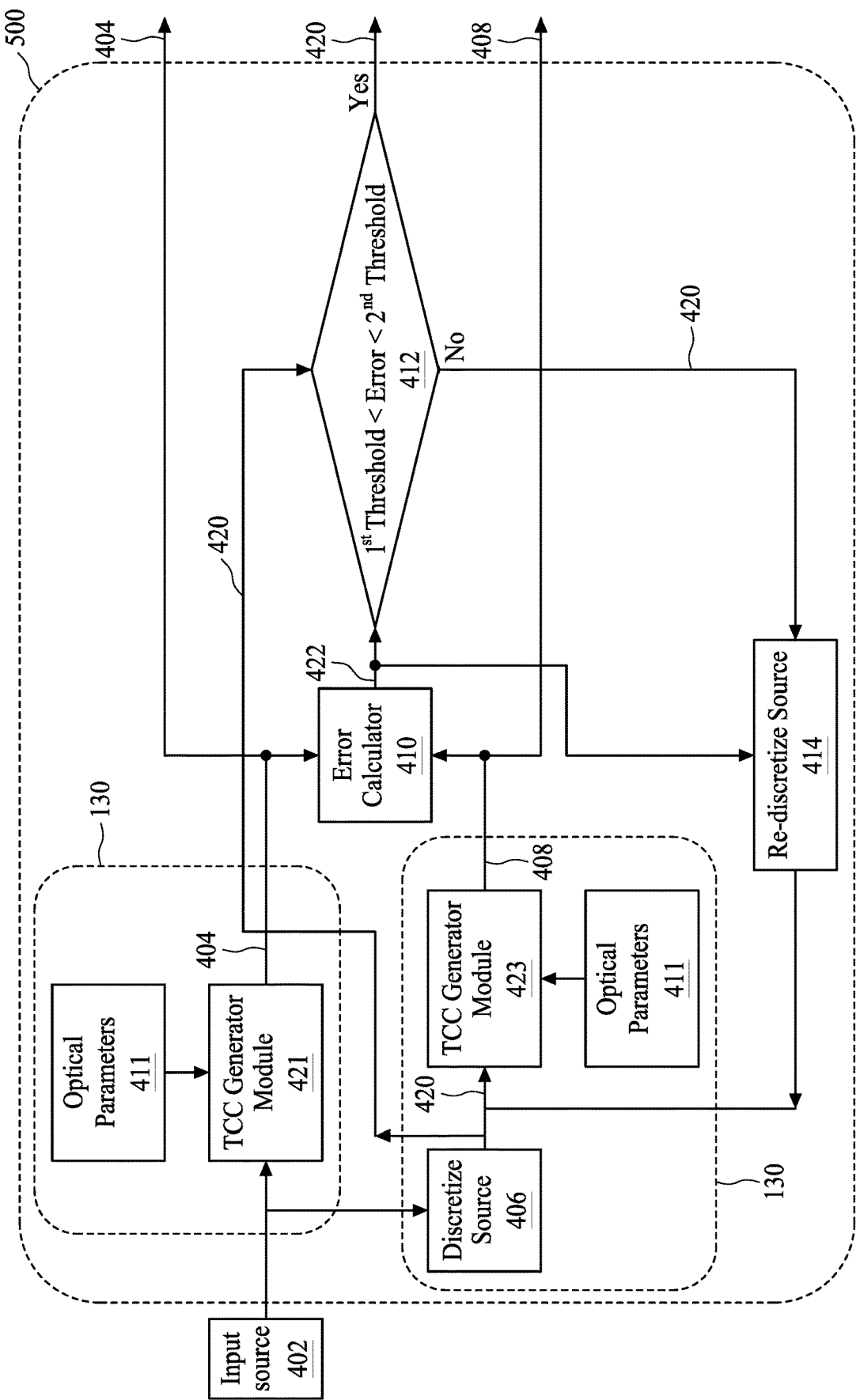
FIG. 5 illustrates a schematic diagram of an exemplary source sampler system for optimizing a transmission cross-coefficient (TCC) operator.

FIG. 5 illustrates a schematic diagram of an exemplary source sampler system 500 for optimizing a TCC operator. FIG. 5 shows an input source 402, e.g., an illumination source, and a TCC generator module 421. In some embodiments, the input source 402, e.g., the illumination source, is a parametric illumination source of an optical system, e.g., optical systems 800 and 850 of FIGS. 8A and 8B, of a lithographic system. In some embodiments, the input source 402 is a laser source. In some embodiments, the input source 402 has a Gaussian profile with a standard deviation between about 1 cm to about 20 cm. In some embodiments, the input source 402 has a circular profile having a radius between 1 cm and 20 cm and having a uniform amplitude. In some embodiments, the input source 402 is one of a coherent or partially coherent source. In some embodiments, the input source 402 is a non-coherent source. In some embodiments, the input source 402 is a deep ultraviolet (DUV) with a wavelength of about 250 nm to about 100 nm, or an extreme ultraviolet (EUV) source with a wavelength of about 100 nm to about 10 nm. In some embodiments, the input source 402 has dimensions of about 1 cm by 1 cm (a diameter of about 2 cm) to about 20 cm by 20 cm (a diameter of about 40 cm). FIG. 5 also shows a discretize source operator 406 and a TCC generator module 423. The discretize source operator 406 performs sampling of the input source 402 and provides a discrete source 420. As shown in FIG. 5, the TCC generator module 421 uses the input source 402 and the optical parameters 411, which includes an exit pupil, consistent with the exit pupil 830 or 831 of FIGS. 8A and 8B, and generates, e.g., calculates, a TCC operator 404. The TCC generator module 423 uses the discrete source 420 and the optical parameters 411 and generates, e.g., calculates, a TCC operator 408. In some embodiments, the TCC generator modules 421 and 423 use equation (2) below to generate the TCC operators 404 and 408. Also, as shown in FIG. 5, the source sampler system 500 provides the TCC operators 404 and 408 and the discrete source 420 as outputs.

Thus, in some embodiments, the TCC operator 404 depends on the input source 402, e.g., a shape and size of the input source 402, and the TCC operator 408 depends on the discrete source 420, e.g., a distribution of the sampled points of the input source 402. As shown below in equation (2), the TCC operator depends on the spatial Fourier transform of the input source. Additionally, the TCC operators 404 and 408 depend on the optical parameters 411 of the lithographic system, e.g., the optical parameters 411 of the optical system of the lithographic system. Thus, the TCC operators 404 and 408 may depend on a wavelength of the illumination source of the optical system, an amount of coherency of the illumination source, a numerical aperture of the optical system, a shape and size of an exit pupil of the optical system, and an aberrations of the optical system. In some embodiments, an error calculator 410 determines an error between the TCC operator 404 and the TCC operator 408. In some embodiments, the error calculator 410 generates an error 422, which is a sum of squared differences between the TCC operator 404 and the TCC operator 408, e.g., an L2 norm, a Frobenius-norm, which is a sum of squared differences between corresponding points of the TCC operator 404 and the TCC operator 408.

In some embodiments, the intensity I of a projected image, e.g., the projected resist pattern 101 of FIG. 2A or the projected resist pattern 458 of FIG. 4 is defined with the following equations (1) and (2):

$$I(x) = \iint M(\alpha)T(\alpha,\alpha')M^*(\alpha')e^{2\pi i(\alpha-\alpha')\cdot x}d\alpha d\alpha' \quad \text{Equation (1)}$$

$$T(\alpha,\alpha') = \int S(\alpha_s)P(\alpha+\alpha_s)P^*(\alpha'+\alpha_s)d\alpha_s \quad \text{Equation (2)}$$

Where $\alpha$ is the spatial frequency coordinates, M is the spatial Fourier transform of the layout pattern of the mask, P is the exit pupil function of the optical system, S is the spatial Fourier transform of the intensity distribution of the illumination source, and T is the TCC operator. In some embodiments, the TCC operator includes the exit pupil function P and the spatial Fourier transform of the illumination source S as shown in equation (2). Additionally, the TCC operator incorporates the operation of the integral of equation (1). In some embodiments, an exit pupil of an optical system is a virtual aperture such that only the rays that pass through the exit pupil can exit the optical system.

In some embodiments, an exit pupil function P(α) is a representation of the exit pupil as a function of the variable α, where α is a two-dimensional (2D) variable in a 2D coordinate system, e.g., a 2D point (α=(F$_x$ and F$_y$)) in a frequency plane. In some embodiments, the TCC generator modules 421 and 423 generate the TCC operator 404 and the TCC operator 408 according to equation (2) as functions of the two variables α and α' and the respective intensity I of equation (1) using the TCC operator 404 and the TCC operator 408 are numerically evaluated. The two variables α and α' are sampled and the TCC operator 404, the TCC operator 408, and the intensity I of equation (1) are calculated at the sampled points of the variables. In some embodiments, the sampling resolution of the of two variables α and α' in the spatial frequency coordinates is higher than the corresponding sampling resolution of the input source 402 and, thus, the sampling of the variables α and α' to evaluate the TCC operators 404 and 408 and the intensity I of equation (1) causes negligible error, e.g., less than one percent, in the calculation of equation (1). In some embodiments, the exit pupil function is a real function represented by an amplitude that has a value of one inside a circle and a value of zero outside the circle. As shown above, the TCC operator depends on the exit pupil function and the illumination source distribution. In some embodiments, the exit pupil function is a complex function that is represented with an amplitude and a phase at each point of the exit pupil function, where the phase of the pupil function includes the aberrations of the optical system. The exit pupil is described with respect to FIGS. 8A and 8B. In some embodiments, the TCC operator is symmetric and positive definite and, thus, can be expanded, with non-negative expansion coefficients λ$_n$, into separable kernels φ$_n$ and φ*$_n$ as shown in equation (3) below:

$$T(α,α')=\Sigma_n \lambda_n \varphi_n(α)\varphi^*_n(α'), \lambda_n=1, 2, 3,$$  Equation (3)

In some embodiments, the kernels are numerically evaluated at sampled points of the variables α and α'. In addition, in some embodiments, the TCC operator 404 and the TCC operator 408 are approximated as a weighted sum of a finite number of the kernels. In some embodiments, the TCC operator 404 or TCC operator 408 are discretized and represented as matrices, e.g., 2D positive definite TCC matrices. In some embodiments, the TCC operator 404 and the TCC operator 408 expand in the same range of variables α and α' and, thus, the TCC matrices corresponding the TCC operator 404 and the TCC operator 408 have the same dimensions. In addition, the integral of equation (1) is represented as a matrix multiplication of a TCC matrix and the discretized spatial Fourier transform of the layout pattern of the mask M. In some embodiments, the TCC generator modules 421 and 423 of the source sampler system 500 further perform a discretization and the TCC operators 404 and 408 are provided as TCC matrices at the output. In addition, the error calculator 410 generates the error 422 as a sum of squared differences between the corresponding elements of the TCC matrices.

In addition, the kernels φ$_n$ and φ*$_n$ are respectively discretized and represented as horizontal or vertical vectors, e.g., one-dimensional (1D) horizontal or 1D vertical matrices. In some embodiments, the error calculator 410 generates the error 422 as a sum of squared differences between the corresponding elements of the TCC matrices. In some embodiments, when the TCC matrix is positive definite, the TCC matrix is expanded into a weighted sum, using the coefficients λ$_n$ as the weights, of a plurality of matrices, where each matrix is generated as the multiplication of each vertical vector and a corresponding horizontal vector associated with one of the kernels φ$_n$ and φ*$_n$. The weighted sum is a matrix form of equation (3). In some embodiments, as shown in equation (3), the TCC operator 404 or TCC operator 408 is expanded into the weighted sum of the kernels. In some embodiments, the TCC operator 404 and/or the TCC operator 408 is approximated by selecting a subset of the kernels φ$_n$ and φ*$_n$. In addition, the projected image of the lithographic mask is approximated by the approximated TCC operators 404 and 408. In some embodiments, the finite number of the kernels are selected by ordering the non-negative coefficients λ$_n$ and then selecting the coefficients λ$_n$ larger than a threshold and the kernels associated with the coefficients larger than the threshold. The coefficients λ$_n$ smaller than the threshold and the kernels associated with the coefficients λ$_n$ smaller than the threshold are discarded.

After calculating the error 422 by the error calculator 410, the error is compared by lower (first) and upper (second) thresholds in operation 412. If the error 422 is within the upper threshold and the lower threshold, the discrete source 420 is acceptable and the discrete source 420 is provided as an output. In some embodiments, the discrete source 420 and the corresponding TCC operator 408 are used for calculating a projection of the mask in the mask projector 130 of FIGS. 2A and 4. In some embodiments, a singular value decomposition is used for defining the kernels and selecting the kernels having the highest energy. In some embodiments, determining the TCC operator 404 or TCC operator 408 includes determining a cross section between two exit pupils P having different offsets α and α' as shown in equation (2). In some embodiments, when the illumination source is partially coherent, determining the TCC operator 404 or TCC operator 408 includes determining a cross section between the two exit pupils and a circle having a radius equal to the coherent length of the illumination source limiting the spatial Fourier transform S of the illumination source.

In some embodiments, if the error 422 is more than the second threshold, the number of sampling points are increased, e.g., based on the error 422, and the discrete source 420 is resampled. The resampling is performed by a re-discretize source 414 operator and the TCC operator 408 is re-determined based on the re-sampled discrete source. In some embodiments, by increasing the number of sampling points, the error 422 is decreased. In some embodiments, if the error 422 is less than the first threshold, the number of sampling points is reduced, e.g., based on the error 422, and the discrete source 420 is resampled by the re-discretize source 414 operator and the TCC operator 408 is re-determined based on the re-sampled discrete source. In some embodiments, by decreasing the number of sampling points, an amount of calculation time of the mask projector 130 is reduced and calculating the projected image becomes faster. Either after reducing or increasing the number of sampling points, the error 422 is recalculated by the error calculator 410 to determine whether the error 422 is maintained between the first threshold and the second threshold. In some embodiments, the error 422 is defined by other norms such as the L-infinity norm (maximum value) or linear algebraic norms, e.g., the Frobenius norm or the nuclear norm, where the linear algebraic norms are used for TCC matrices.

Figure 6A:
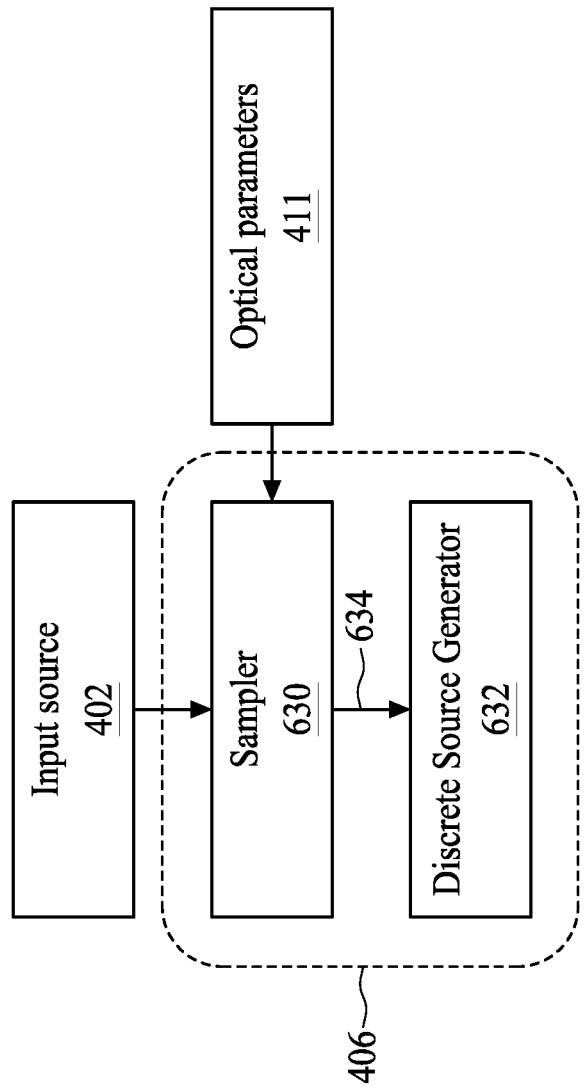
Figure 6C:
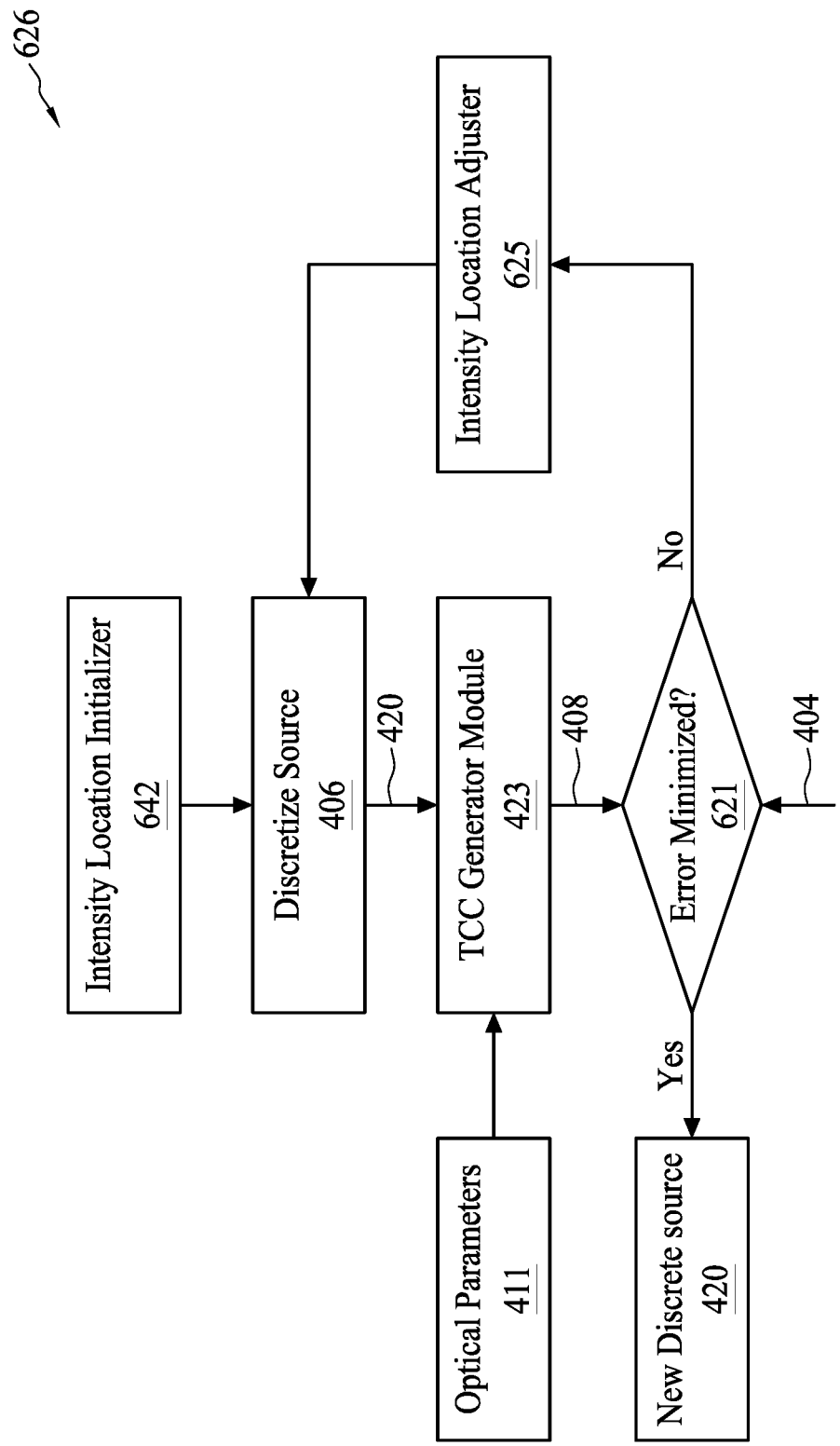

FIGS. 6A, 6B, and 6C illustrate schematic diagrams of exemplary systems for sampling and re-sampling an illumination source and generating a TCC operator. FIG. 6A shows a diagram for sampling the input source 402. In some embodiments, the input source 402 is a parametric illumination source as described above. The input source 402 is sampled by a sampler 630 that determines the number of sampling points and a distribution of the sampled points. In some embodiments, the sampler 630 uses the optical parameters 411, described above, to determine a number of sampling points, e.g., sampling resolution, of the input source 402 to produce the discrete source 420. In some embodiments, the sampler 630 uses the Nyquist rate based on a spatial frequency content of the input source 402 to determine the number of sampling points. In addition, a discrete source generator 632 receives the number of sampling points and determines how the sampling points are distributed, e.g., uniformly or non-uniformly, in the input source 402. In some embodiments, a combination of the sampler 630 and the discrete source generator 632 is consistent with the discretize source operator 406 of FIG. 5.

FIG. 6B shows a diagram for re-sampling the discrete source 420. The discrete source 420 is re-sampled by a re-sampler 624 that determines a modified number of sampling points 634 and a distribution of the modified sampled points. In some embodiments, the re-sampler 624 uses the optical parameters 411, described above, and the error 422 to determine the modified number of sampling points 634, e.g., a modified sampling resolution, of the discrete source 420 to produce a modified discrete source. In some embodiments, a discrete source generator 626 receives the modified number of sampling points 634 and determines how the modified sampling points are distributed. In some embodiments, a combination of the re-sampler 624 and the discrete source generator 626 is consistent with the re-discretize source 414 of FIG. 5. In some embodiments, a local or a global operator is used for resampling. In some embodiments, the discrete Fourier transform operator is used for resampling such that the original sampled points of the discrete source 420 are Fourier transformed to the frequency domain. Then, the inverse Fourier transform is applied to the frequency domain to generate a continuous inverse Fourier transform function in the spatial domain. The inverse Fourier transform function is sampled by the modified number of sampling points at the locations defined by the discrete source generator 626.

FIG. 6C shows a diagram for distributing the modified number of sampling points and defining the locations of the modified number of sampling points. The intensity location initializer 642 receives the modified number of sampling points and uniformly distributes the modified number of sampling points. The discretize source operator 406 finds an intensity of the modified number of sampling points, e.g., by performing Fourier transform/inverse Fourier transform described above. The discretize source operator 406 generates a new discrete source 420. The error 422 when using the new discrete source 420 to generate a new TCC operator 408 is calculated between TCC operator 408 and the TCC operator 404 at operation 621. The location of the modified number of sampling points are recursively modified by an intensity location adjuster 625 until the error 422 is minimized. A new discrete source 420 is generated when the error 422 is minimized. In some embodiments, the error 422 is minimized when the error 422 is between the second threshold that is defined with respect to FIG. 5.

Figure 7A:
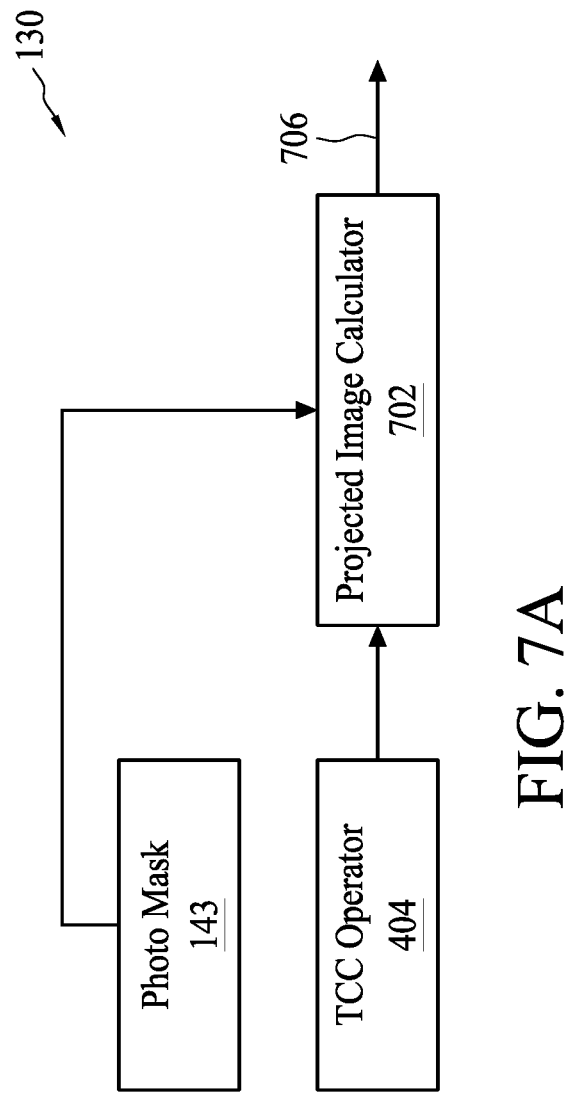
FIGS. 7A and 7B illustrate schematic diagrams of exemplary systems for calculating projection images using a TCC operator in accordance with some embodiments of the disclosure.
Figure 7B:
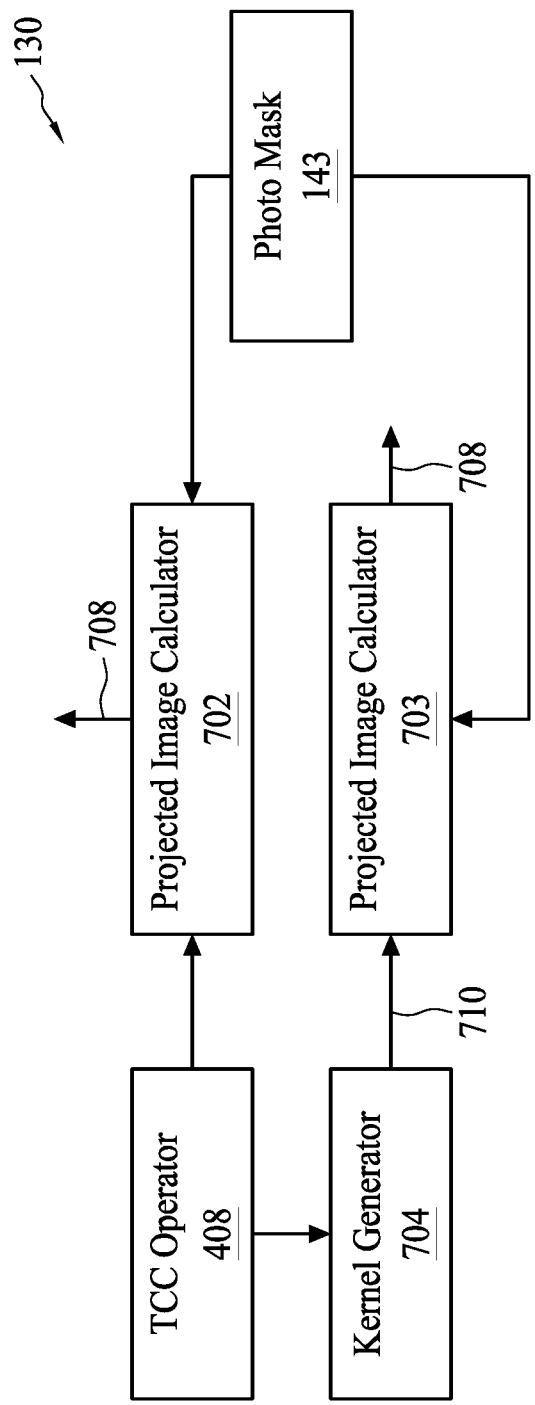

FIGS. 7A and 7B illustrate schematic diagrams of exemplary systems for calculating projection images using a TCC operator. FIGS. 7A and 7B show different implementations of the mask projector 130 of FIGS. 2A and 4 that is consistent with the mask projector 130 of FIG. 5. FIG. 7A shows a projected image calculator 702 that generates, consistent with equation (1), the result of performing the TCC operator 404 on the layout pattern of the photo mask 143 to produce a projected image 706 consistent with the projected resist pattern 101 of FIG. 2A or the projected resist pattern 458 of FIG. 4. FIG. 7B shows the projected image calculator 702 that generates, consistent with equation (1), the result of performing the TCC operator 408 on the layout pattern of the photo mask 143 to produce a projected image 708 consistent with the projected resist pattern 101 of FIG. 2A or the projected resist pattern 458 of FIG. 4. As shown in FIG. 7B, the TCC operator can be factored into kernels by a kernel generator 704 and kernels 710 are used by a projected image calculator 703 for producing the projected image 708 in some embodiments.

Figure 8A:
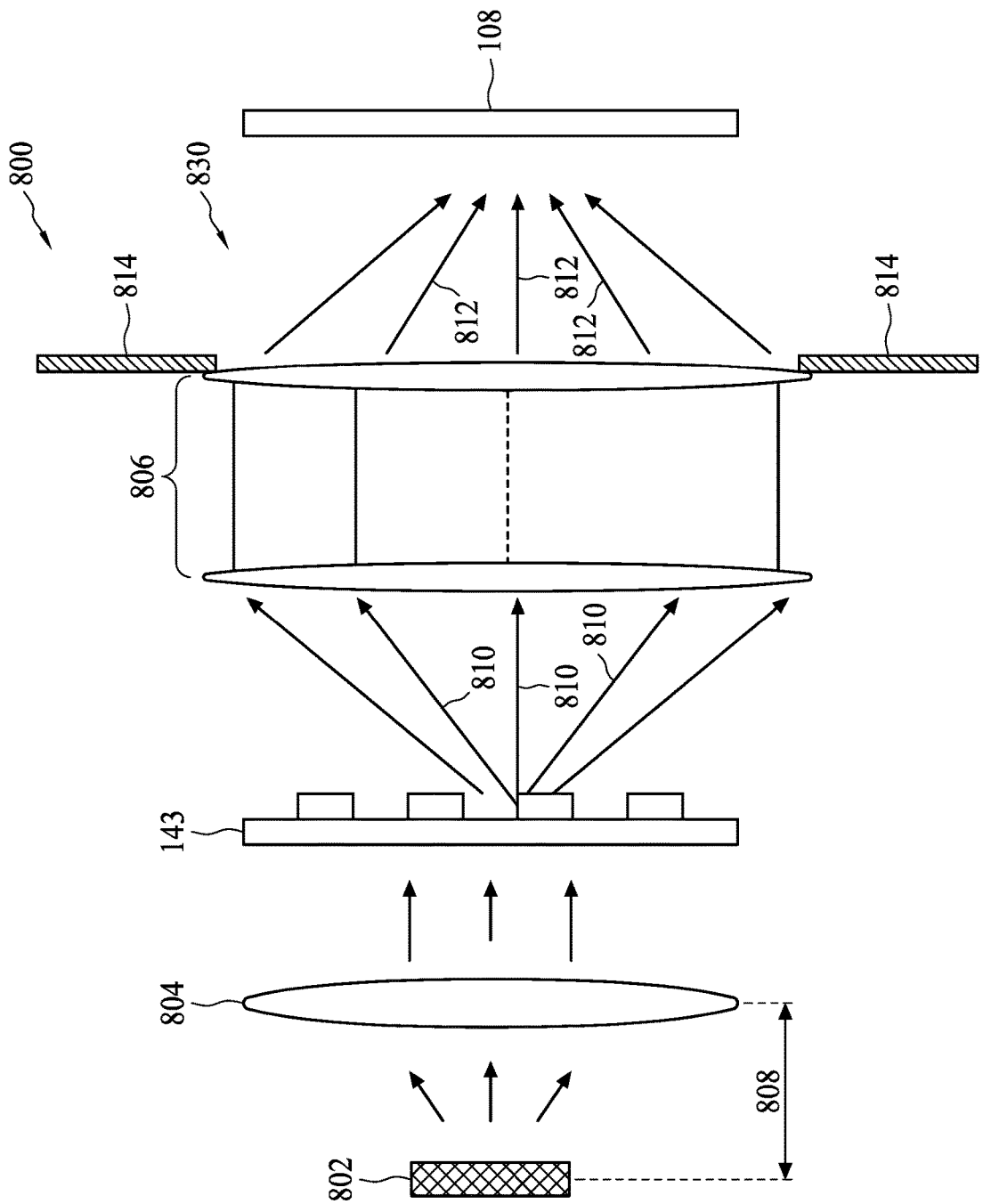
FIGS. 8A and 8B illustrate schematic diagrams of exemplary optical systems of an optical system of a lithographic system.
Figure 8B:
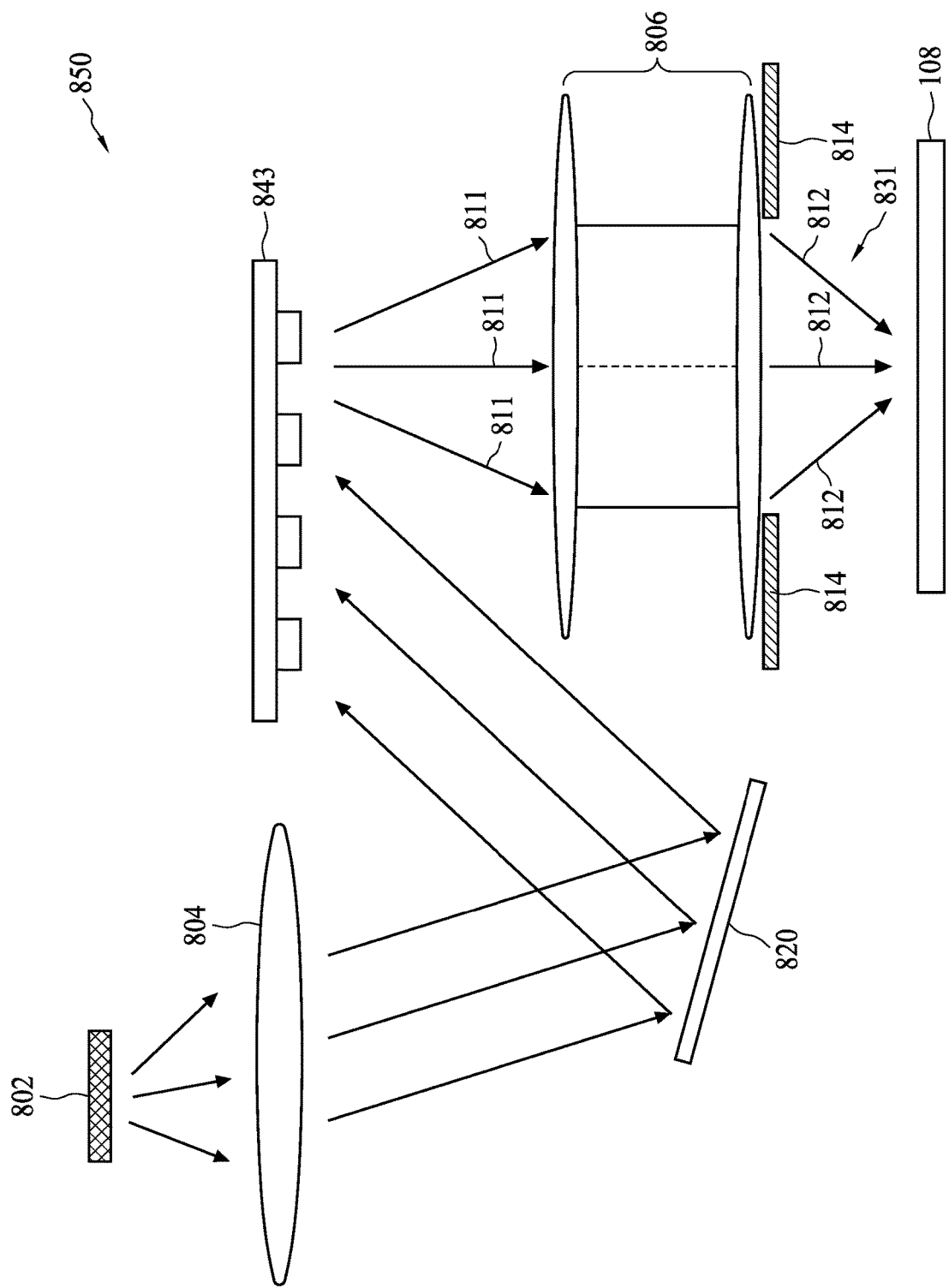

FIGS. 8A and 8B illustrate schematic diagrams of exemplary optical systems of an optical system of a lithographic system. FIG. 8A shows an optical system 800 that is used in a lithographic system in some embodiments. The optical system 800 shows an illumination source 802 at a distance 808 from a lens 804. The lens 804 transmits a radiation beam of the light source through the photo mask 143. The transmitted radiation beam 810 converges using an objective lens system 806 to generate the convergent beam 812 and to create a projected image of the photo mask 143 on the wafer 108. As shown, blades 814 block any radiation that is outside an exit pupil 830 of the optical system 800. FIG. 8B shows an optical system 850 that is used in a lithographic system in some embodiments. The optical system 850 shows the illumination source 802. The lens 804 transmits a radiation beam of the illumination source 802. The radiation beam is reflected by a mirror 820 and is directed towards a mask 843, e.g., a reflective mask, and produces the reflected radiation beam 811 that is reflected off the mask 843. The reflected radiation beam 811 converges using the objective lens system 806 to generate a convergent beam 812 and to create a projected image of the reflected mask 843 on the wafer 108. FIG. 8B also shows the exit pupil 831 of the optical system 850.

Figure 9:
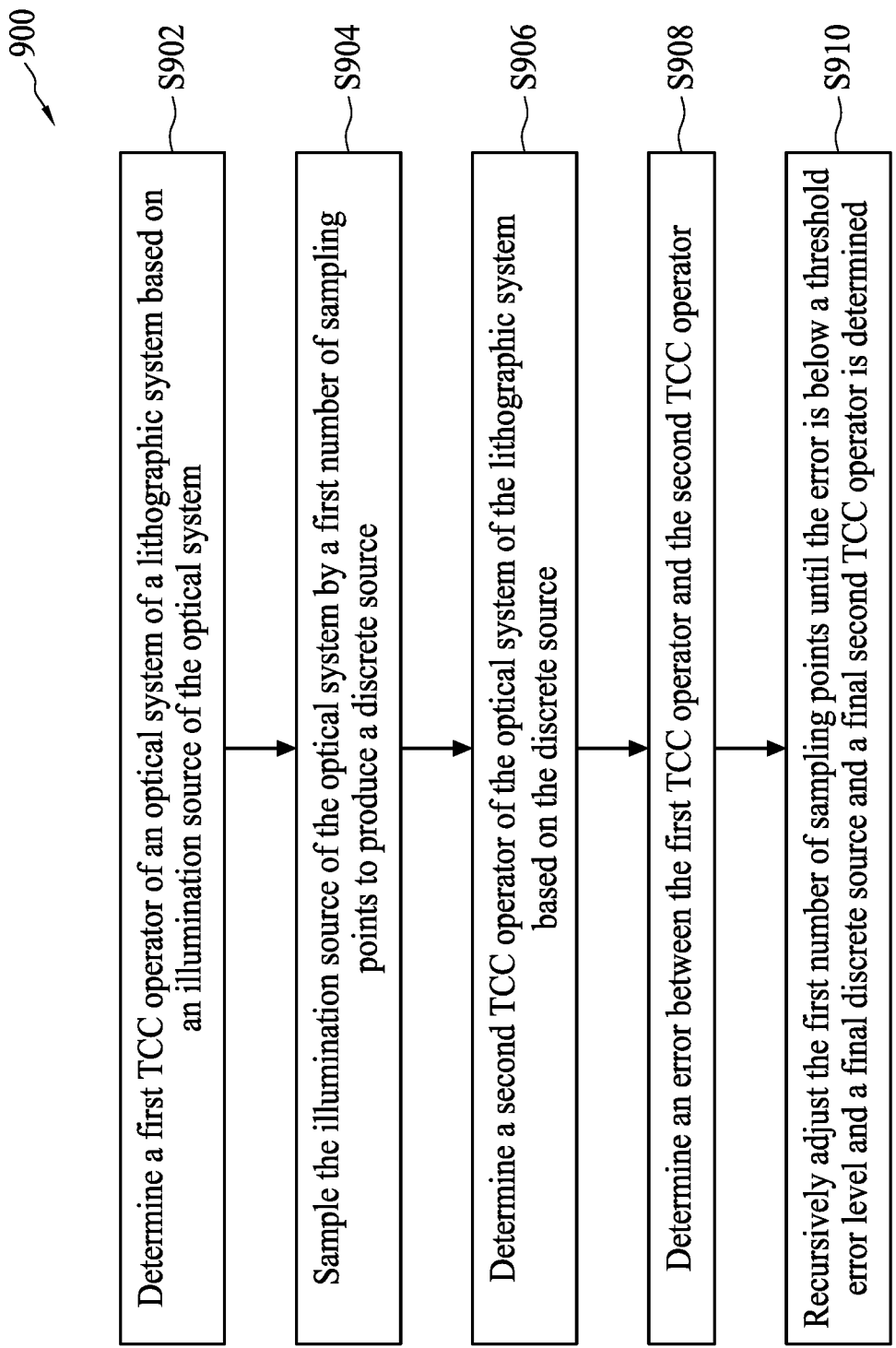
FIG. 9 illustrates a flow diagram of an exemplary process for enhancing a photo mask in accordance with some embodiments of the disclosure.

FIG. 9 illustrates a flow diagram of an exemplary process for enhancing a photo mask in accordance with some embodiments of the disclosure. The process 900 may be performed by the system of FIGS. 2A and 11. In some embodiments, the process 900 or a portion of the process 900 is performed and/or is controlled by the computer system 1000 described below with respect to FIGS. 10A and 10B. In some embodiments, the process 900 is performed by the system 1100 of FIG. 11. The method includes an operation S902 of determining a first TCC operator of an optical system of a lithographic system based on an illumination source of the optical system. In some embodiments, the TCC operator 404 of FIG. 7A is produced based on an input source 402, e.g., the illumination source. In operation S904, the illumination source, e.g., the input source 402, of the optical system is sampled by a first number of sampling points to produce a discrete source 420. In operation S906, a second TCC operator of the optical system of the lithographic system is determined based on the discrete source. In some embodiments, the TCC operator 408 of FIG. 7B is determined based on the discrete source 420.

In operation S908, an error is determined between the first TCC operator and the second TCC operator. In some embodiments, the first TCC operator and the second TCC operator are respectively discretized and a first TCC matrix and a second TCC matrix are generated. The error is determined between the first TCC matrix and the second TCC matrix. In operation S910, the first number of sampling points is recursively adjusted until the error is below a threshold level and a final discrete source and a final second TCC operator 408 is determined. In some embodiments, the adjusting the first number of sampling points is described with respect to FIG. 11. In some embodiments, the iterations continue until the error is less than or equal to a threshold value. In some embodiments, the error is positive and the first number of sampling points is modified such that the error is maintained in an error-range such that the error is less than a positive second threshold level but greater than a positive first threshold level smaller than the second threshold level. In some embodiments, if the error is greater than the second threshold level, the first number of sampling points is increased to increase the accuracy of determining, e.g., calculating, the projected image of the mask projectors 130 of FIGS. 2A, 4, 7A, and 7B. Conversely, if the error is less than the first threshold level, the first number of sampling points is reduced to increase the speed of determining, e.g., calculating, the projected image of the mask projectors 130 of FIGS. 2A, 4, 7A, and 7B.

Figure 10A:
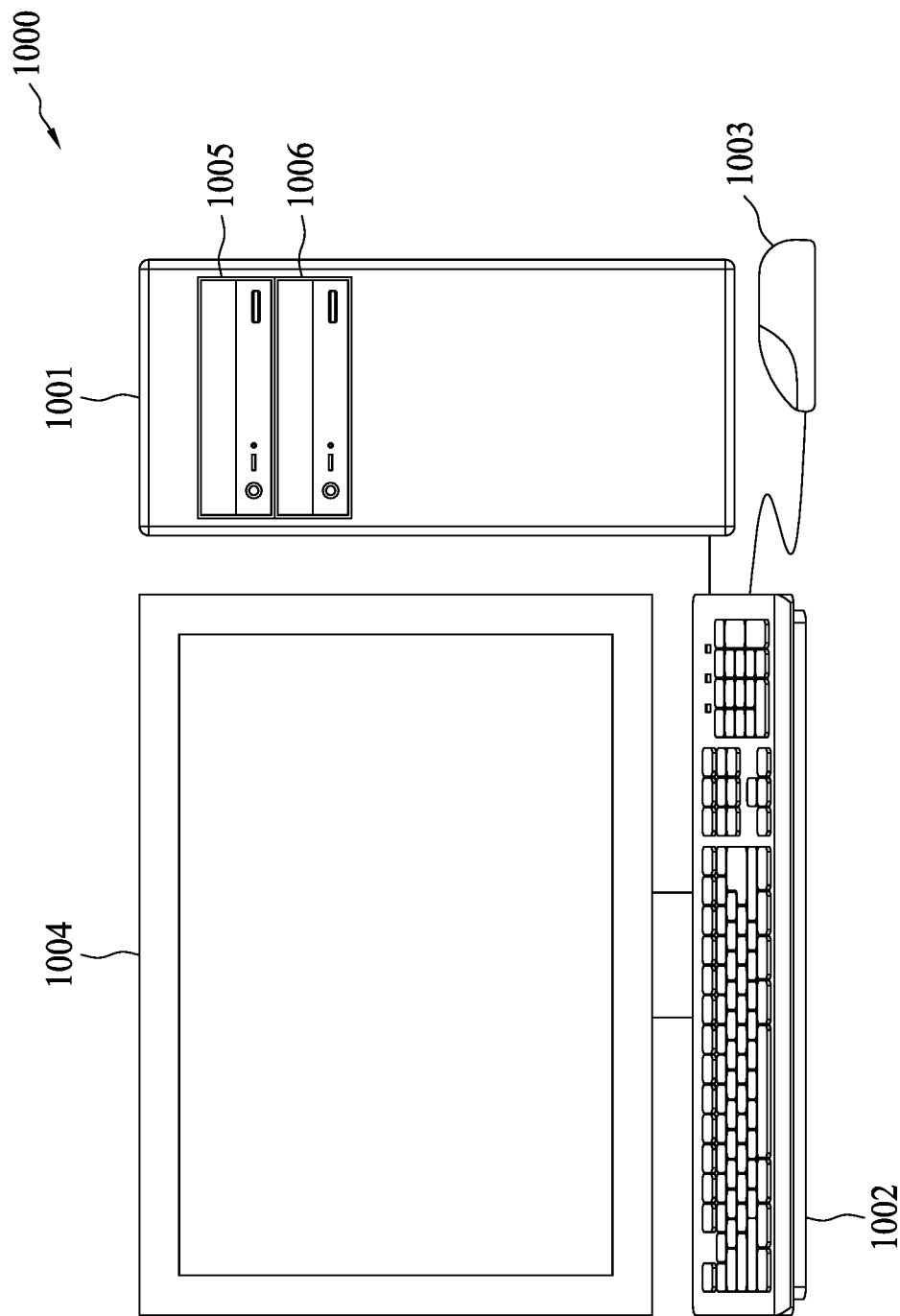
FIGS. 10A and 10B illustrate an apparatus for enhancing a photo mask in accordance with some embodiments of the disclosure.
Figure 10B:
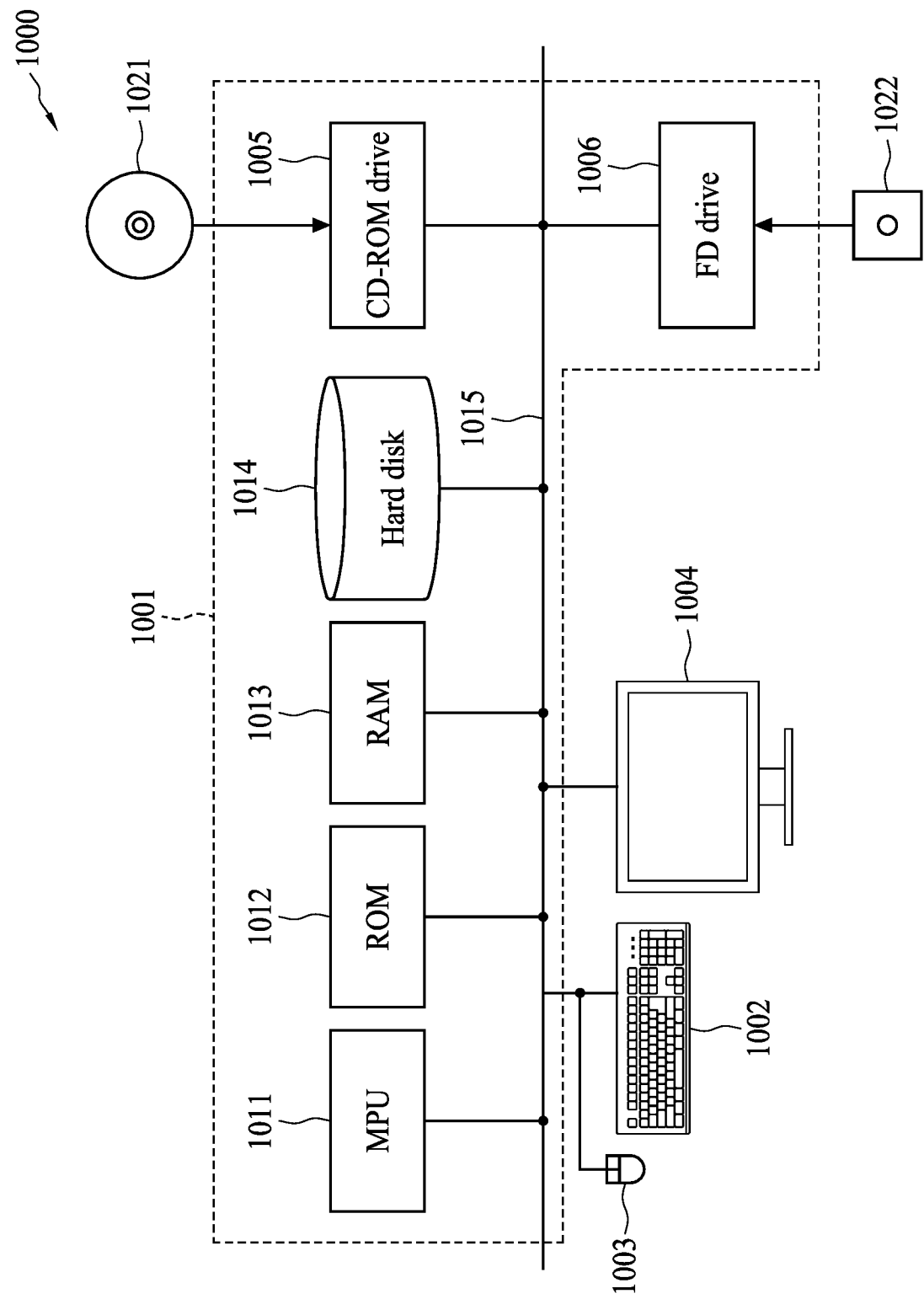

FIGS. 10A and 10B illustrate an apparatus for enhancing a photo mask in accordance with some embodiments of the disclosure. In some embodiments, the computer system 1000 is used for enhancing a photo mask. Thus, in some embodiments, the computer system 1000 performs the functions of the OPC enhancer 122, the mask projector 130, and the OPC verifier 140 of FIG. 2A. In some embodiments, as will be described in FIG. 11, the computer system 1000 performs the functions of the analyzer module 1130, main controller 1140, the mask enhancer 1104, and the mask verifier 1108. In some embodiments, the computer system 1000 performs a simulation of the mask projector 1106 and the optical system 1105. FIG. 10A is a schematic view of a computer system that performs the enhancing of a photo mask. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions of an apparatus for performing the enhancement of a photo mask in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions for enhancing a photo mask in the foregoing embodiments. The program may only include a command portion to call an appropriate function (module) in a controlled mode and obtain desired results.

Figure 11:
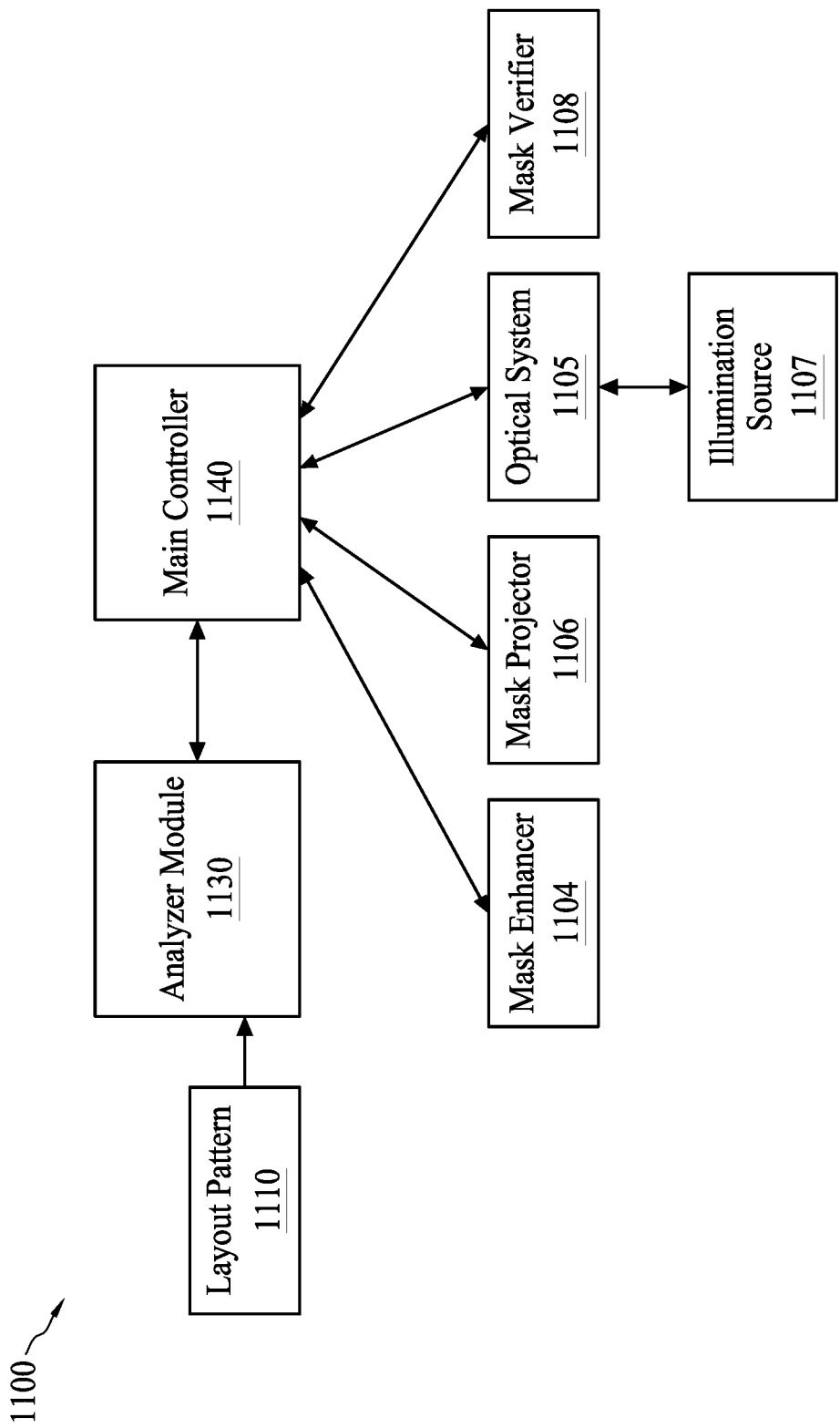
FIG. 11 illustrates an exemplary system of enhancing a photo mask in accordance with some embodiments of the disclosure.

FIG. 11 illustrates an exemplary system 1100 of enhancing a photo mask in accordance with some embodiments of the disclosure. The system 1100 includes an analyzer module 1130 and a main controller 1140 coupled to each other. The analyzer module 1130 receives the layout pattern 1110, which is consistent with the target layout pattern M of FIGS. 1 and 2A. The analyzer module 1130 may send the layout pattern 1110 to a mask enhancer 1104 that is coupled to the main controller 1140. In some embodiments, the analyzer module 1130, which is consistent with the discretize source operator 406 and the re-discretize source 414 of FIG. 5, determines the initial number of sampling points and the initial location of the sampling points. The initial location of the sampling points may be uniformly distributed in an intensity or amplitude profile of the illumination source 1107, which is consistent with the illumination source 802 of FIGS. 8A and 8B. The main controller 1140 is also coupled to a mask projector 1106, consistent with mask projector 130 of FIGS. 1 and 2A, an optical system 1105, and a mask verifier 1108. The optical system 1105 is consistent with the optical systems 800 and 850 of FIGS. 8A and 8B and the mask verifier 1108 is consistent with the OPC verifier 140 of FIG. 2A and the ILT verifier 456 of FIG. 4.

In some embodiments, the mask enhancer 1104 performs the OPC or ILT operations on the layout pattern 1110 and the mask enhancer 1104 is consistent with the ILT enhancer 452 of FIG. 4 or the OPC enhancer 122 of FIG. 2A. In some embodiments, instead of the mask enhancer 1104, the analyzer module 1130 performs the OPC or ILT operations on the layout pattern 1110 and, thus, the analyzer module 1130 is further consistent with the ILT enhancer 452 of FIG. 4 or the OPC enhancer 122 of FIG. 2A. In some embodiments, the mask enhancer 1104 or the analyzer module 1130 determines the TCC operator, e.g., the TCC operator 404 or the TCC operator 408, of an optical system 1105 of a lithographic system and, thus, the mask enhancer 1104 or the analyzer module 1130 and the main controller 1140 together are further consistent with the source sampler system 500. In some embodiments, the optical system 1105 is consistent with the optical systems 800 and 850 of FIGS. 8A and 8B. In some embodiments, the mask enhancer 1104 or the analyzer module 1130 determines the TCC operator, e.g., the TCC operator 404, of the optical system 1105 of the lithographic system based on an illumination source, e.g., illumination source 802 of FIG. 8A or 8B or illumination source 1107 of FIG. 11. In addition, the mask enhancer 1104 or the analyzer module 1130 determines the TCC operator of the optical system 1105 of the lithographic system based on an exit pupil of an optical system, e.g., the exit pupils 830 and 831 of FIGS. 8A and 8B as shown in equation (2). The mask enhancer 1104 or the analyzer module 1130 also determines another TCC operator, e.g., TCC operator 408, of the optical system 1105 or of the optical systems 800 and 850 of FIGS. 8A and 8B based on a discrete source, e.g., the sampled source, and the exit pupils 830 or 831.

As shown in the system 1100, the mask enhancer 1104 is coupled to the analyzer module 1130 through the main controller 1140. In some embodiments, the mask enhancer 1104 is consistent with the OPC enhancer 122 of FIG. 2A. The system 1100 includes a mask projector 1106 that is coupled to the analyzer module 1130 through the main controller 1140. In some embodiments, the mask projector 1106 is consistent with the mask projector 130 of FIG. 2A. The system 1100 further includes a mask verifier 1108 that is coupled to the analyzer module 1130 through the main controller 1140. In some embodiments, as noted, the mask verifier 1108 is consistent with the OPC verifier 140 of FIG. 2A. In some embodiments, the mask enhancer 1104, the mask projector 1106, and the mask verifier 1108 are included in the main controller 1140. In some embodiments, adjusting the first number of sampling points is performed by either of the analyzer module 1130 or the mask enhancer 1104. In some embodiments, the mask projector 1106 is consistent with the combination of the operations performed in FIGS. 7A and 7B.

In some embodiments, the illumination source, e.g., input source 402 of FIGS. 5, and 6A, is a polarized illumination source. Thus, each one of the electrical or magnetic fields at each point of the input source 402 may be represented by a vector in a plane perpendicular to the direction of travel of the light. In some embodiments, the light at each point of the input source 402 travels in the Z-direction and, thus, the electrical or magnetic fields of the light are in the XY-plane and may be represented by components in the X-direction and Y-direction. In some embodiments, the spatial Fourier transform S of the intensity distribution of the input source 402, at each spatial frequency $\alpha_s$, is represented as a 2 by 2 matrix $S_{2\times2}$ in equation (4) below where $S_{xy}=S^*_{yx}$.

$$S_{2\times2}(\alpha_s) = \begin{bmatrix} S_{xx} & S_{xy} \\ S_{yx} & S_{yy} \end{bmatrix} \quad \text{Equation (4)}$$

In some embodiments, the polarization of the input source 402 continuously change with time and, thus, instead of the temporal values of the input source 402, a time-averaged variance of the electrical or magnetic fields in the two X-direction ($s_{xx}$) and Y-direction ($s_{yy}$) and a time-averaged covariance between the electrical or magnetic fields in the two directions ($s_{xy}$ or $s_{yx}$) are used. In some embodiments, the matrix elements of equation (4) are the spatial Fourier transform of the variance functions and the covariance function at a spatial frequency $\alpha_s$.

Figure 12:
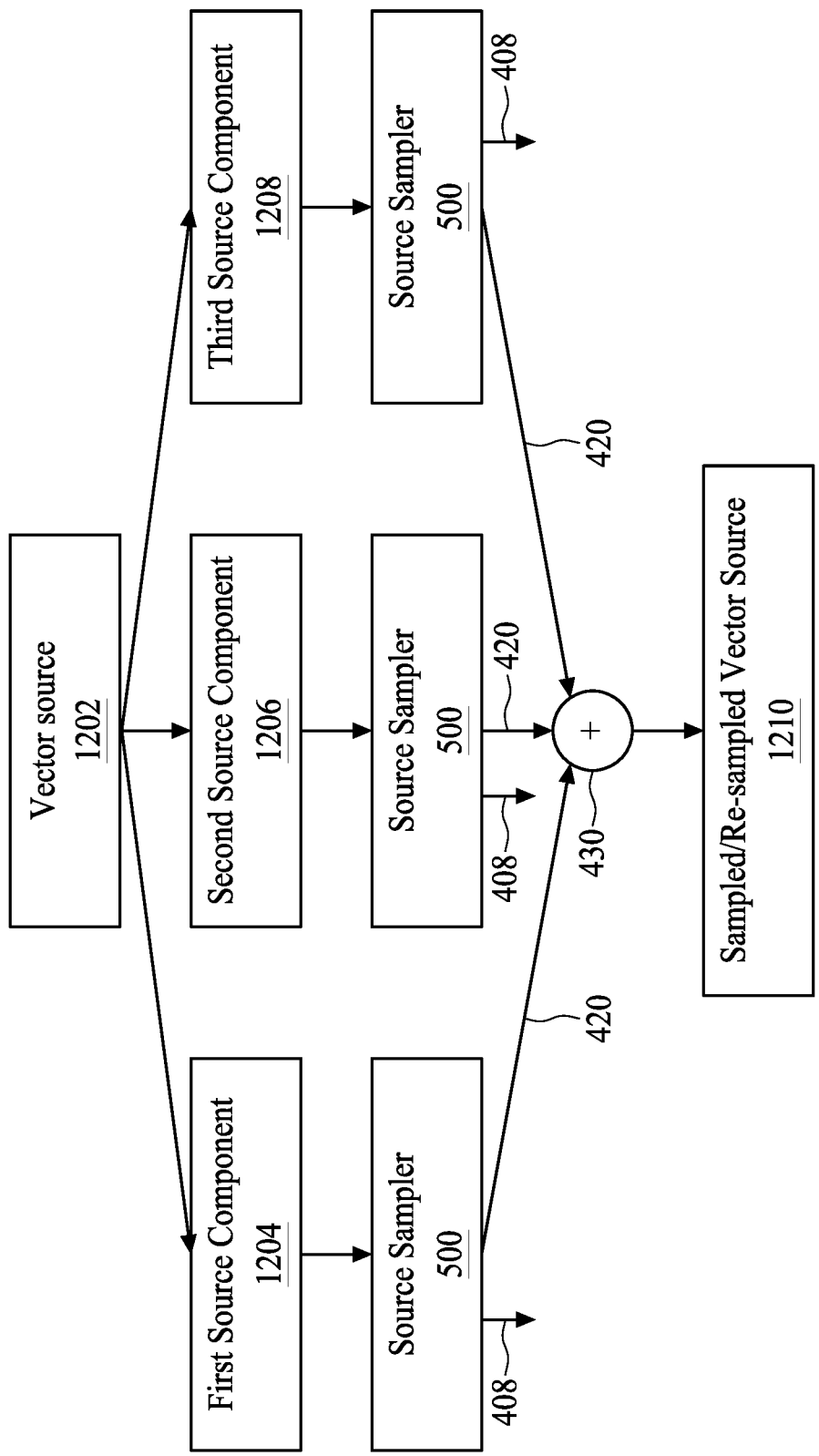
FIG. 12 illustrates a schematic diagram of an exemplary source sampler system for optimizing a TCC operator for vector optics.

FIG. 12 illustrates a schematic diagram of an exemplary source sampler system for optimizing a TCC operator for vector optics. FIG. 12 shows a vector source, e.g., a polarized illumination source 1202. As described above the variance and covariance of the polarized illumination source 1202 are determined, e.g., calculated. As shown, a first source component 1204 is the variance $s_{xx}$ of the polarized illumination source 1202, a second source component 1206 is the variance $s_{yy}$ of the polarized illumination source 1202, and a third source component 1208 is the covariance $s_{xy}$ of the polarized illumination source 1202. Because of the covariance symmetry, one of the $s_{xy}$ or $s_{yx}$ is used. The first, second, and third source components 1204, 1206, and 1208 are used as independent illumination sources for the three source sampler systems 500 of FIG. 12. As shown in FIG. 5, each one of the source sampler systems 500 provide a sampled/re-sampled discrete source 420 at the output. The sampled/re-sampled discrete sources 420 are added component-wise, at operation 430, and the polarized sampled/re-sampled illumination source 1210 is generated. In some embodiments, the polarized illumination source 1202 is not yet sampled and each source sampler system 500 provides a sampled source. In some embodiments, the polarized illumination source 1202 is already sampled and each source sampler system 500 provides a resampled source. In some embodiments, a single sampling resolution is selected for the first, second, and third source components 1204, 1206, and 1208. In some embodiments, a highest sampling resolution provided by the three source sampler systems 500 is selected for all three of the source sampler systems 500. The source components having sampling resolutions lower than the highest sampling resolution are resampled such that the first, second, and third source components 1204, 1206, and 1208 have the same highest sampling resolution. The first, second, and third source components 1204, 1206, and 1208 are combined to produce a single polarized sampled illumination source 1210. Then a TCC operator or a TCC matrix corresponding to the single polarized sampled illumination source 1210 is computed using a generalization of equation (2) using the components of the single polarized sampled illumination source 1210 to determine a TCC operator or a TCC matrix and the TCC operator or the TCC matrix is used to determine the intensity I of the projected image using a generalization of equation (1).

According to some embodiments of the present disclosure, a method of enhancing a layout pattern includes determining a first transmission cross coefficient (TCC) operator of an optical system of a lithographic system based on an illumination source of the optical system of the lithographic system. The method includes sampling the illumination source of the optical system by a first number of sampling points to produce a first discrete source and determining a second TCC operator of the optical system of the lithographic system based on the first discrete source. The method also includes determining an error between the first TCC operator and the second TCC operator. The method further includes recursively adjusting the first number of sampling points to re-sample the illumination source and to re-determine the second TCC operator based on the re-sampled illumination source until the error is below a threshold level and a final discrete source and a final second TCC operator is determined. The method includes performing an optical proximity correction (OPC) operation of a first layout pattern of a photo mask, the OPC operation uses the final discrete source and the final second TCC operator to determine a projected image of the first layout pattern of the photo mask on a wafer. In an embodiment, the first layout pattern of the photo mask includes one or more of specific features, and using the final discrete source and the final second TCC operator to determine the projected image of the first layout pattern generates the one or more specific features on a resist layer on the wafer. In an embodiment, the specific features include one or more of a curvature, a vertical line, or a horizontal line. In an embodiment, the method further includes receiving an illumination profile of the illumination source and sampling the illumination profile of the illumination source at a number of locations equal to the first number of sampling points. In an embodiment, the sampling the illumination source is a non-uniform sampling and the re-sampling the illumination source is a uniform sampling. In an embodiment, the illumination profile is one of an amplitude profile or an intensity profile of the illumination source. In an embodiment, the method further includes producing the OPC corrected first layout pattern on a mask-blank to create a photo mask.

According to some embodiments of the present disclosure, a method of enhancing a layout pattern includes determining a first transmission cross coefficient (TCC) operator of an optical system of a lithographic system based on an illumination source of the optical system and an exit pupil of the optical system of the lithographic system. The method includes sampling the illumination source of the optical system by a first number of sampling points at a first number of sampling locations to make a first discrete source and determining a second TCC operator of the optical system of the lithographic system based on the first discrete source and the exit pupil of the optical system. The method also includes determining an error between the first TCC operator and the second TCC operator. The method further includes recursively adjusting the first number of sampling points and the first number of sampling locations to re-sample the illumination source and to re-determine the second TCC operator based on the re-sampled illumination source until the error is within a threshold error range and a final discrete source and a final second TCC operator is determined, the threshold error range has an upper limit and a lower limit. The method includes performing an inverse lithographic transformation (ILT) operation of the first layout pattern of a photo mask, the ILT operation uses the final discrete source and the final second TCC operator to determine a projected image of the first layout pattern of the photo mask on a wafer for determining an ILT enhancement of the first layout pattern and producing the ILT enhanced first layout pattern on a mask-blank to create the photo mask. In an embodiment, the error is above the upper limit of the threshold error range and the re-sampling the illumination source includes increasing the first number of sampling points to a second number of sampling points, uniformly sampling the illumination source with the second number of sampling points, and recursively adjusting sampling locations of the second number of sampling points to re-sample the illumination source and to re-determine the second TCC operator based on the re-sampled illumination source until the error is minimized. In an embodiment, the error is below the lower limit of the threshold error range and the re-sampling the illumination source includes decreasing the first number of sampling points to a second number of sampling points, uniformly sampling the illumination source with the second number of sampling points, and recursively adjusting sampling locations of the second number of sampling points to re-sample the illumination source and to re-determine the second TCC operator based on the re-sampled illumination source until the error is minimized. In an embodiment, the method further includes representing the final second TCC operator by a weighted sum of a plurality of kernels in a kernel space, approximating the final second TCC operator by a weighted sum of two or more kernels of the plurality of kernels, and using the approximated final second TCC operator and the first discrete source to determine the projected image of the first layout pattern of the photo mask on the wafer. In an embodiment, the first TCC operator and the second TCC operator are respectively discretized to generate a first TCC matrix and a second TCC matrix, and the method further includes determining the error by determining a Frobenius-norm error between the first TCC matrix and the second TCC matrix. In an embodiment, the method further includes that prior to the performing the ILT operation of the first layout pattern: performing an optical proximity correction (OPC) operation of the first layout pattern, the ILT operation uses the final discrete source and the final second TCC operator to determine a projected image of the first layout pattern of the photo mask on the wafer, and performing the ILT operation of the OPC corrected first layout pattern using the final discrete source and the final second TCC operator to determine the projected image of the OPC corrected first layout pattern of the photo mask on the wafer. In an embodiment, the method further includes receiving a second layout pattern, different from the first layout pattern, of the photo mask of the lithographic system, and performing the ILT of the second layout pattern using the final discrete source and the final second TCC operator to determine a projected image of the second layout pattern of the photo mask on the wafer.

According to some embodiments of the present disclosure, a lithographic system includes a main controller, a photo mask, a mask enhancer coupled to the main controller, an optical system including an illumination source and coupled to the main controller, and a mask projector coupled to the main controller and the mask enhancer and to produce a projection of the photo mask on a wafer. The system also includes an analyzer module coupled to the main controller, the analyzer module receives a first layout pattern of the photo mask to be produced on the wafer. The mask enhancer is coupled to the analyzer module through the main controller and receives the first layout pattern from the analyzer module and to perform one of an optical proximity correction (OPC) operation or an inverse lithographic transformation (ILT) operation of the first layout pattern. The mask enhancer also determines a final discrete source and a final second TCC operator by receiving a first number of sampling points from the analyzer module, determining a first transmission cross coefficient (TCC) operator of an optical system of the lithographic system based on the illumination source of the optical system and an exit pupil of the optical system, sampling the illumination source of the optical system by the first number of sampling points to make a first discrete source, determining a second TCC operator of the optical system of the lithographic system based on the first discrete source and the exit pupil of the optical system, determining an error between the first TCC operator and the second TCC operator, and recursively adjusting the first number of sampling points to re-sample the illumination source and to re-determining the second TCC operator based on the re-sampled illumination source until the error is below a threshold level and the final discrete source and the final second TCC operator is determined. The mask projector performs the projection of the photo mask on the wafer for the OPC operation or the ILT operation using the final discrete source and the final second TCC operator to determine a projected image of the first layout pattern of the photo mask on the wafer. In an embodiment, the illumination source is a laser source. In an embodiment, the illumination source is one of a coherent source or a partially coherent source. In an embodiment, the profile of the illumination source is either a circular profile having a radius between 1 cm and 20 cm and having a constant amplitude, Or a Gaussian profile with a standard deviation between 1 cm and 20 cm. In an embodiment, the illumination source of the optical system is a polarized illumination source with two time varying electric or magnetic components in a first direction and in a second directions perpendicular to the first direction. The first and second directions are perpendicular to a direction of travel of a beam of the polarized illumination source. The analyzer module further determines a first variance profile of the component in the first direction, a second variance profile of the component is the second direction, and a covariance profile between the components of the first and second directions of the polarized illumination source. The mask enhancer also assigns one of the first variance profile, the second variance profile, or the covariance profile to the profile of the illumination source, determines a final discrete profile of the assigned first variance profile, second variance profile, or the covariance profile, and determines a final second TCC operator of the assigned first variance profile, second variance profile, or the covariance profile. The mask projector also performs a projection of the first layout pattern of the photo mask by the assigned profile of the polarized illumination source on the wafer for the OPC operation or the ILT operation using the determined final discrete profile and the final second TCC operator. In an embodiment, the illumination source is one of a deep ultraviolet or an extreme ultraviolet illumination source.

In some embodiments, implementing the processes and methods mentioned above, adapts the target layout pattern to a modified target layout pattern by using projection simulation. The illumination source of the simulated projection is the illumination source of the optical system of the lithographic system that is sampled. The number of sampling points is adjusted such that the number of sampling points is not too many to create a calculation burden and so that the number of sampling points is not too few to generate a discrepancy between the simulated projection and the physical projection. Therefore, the described methods above provide an efficient number of sampling points to maintain the error between the simulated projection and the physical projection within a desired range without creating unnecessary calculations.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   determining a first transmission cross coefficient (TCC) operator of an optical system of a lithographic system based on an illumination source of the optical system of the lithographic system;
   sampling the illumination source of the optical system by a first number of sampling points to produce a first discrete source;
   determining a second TCC operator of the optical system of the lithographic system based on the first discrete source;
   determining an error between the first TCC operator and the second TCC operator;
   recursively adjusting the first number of sampling points to re-sample the illumination source and to re-determine the second TCC operator based on the re-sampled illumination source until the error is below a threshold level and a final discrete source and a final second TCC operator is determined; and
   performing an optical proximity correction (OPC) operation of a first layout pattern of a photo mask, wherein the OPC operation uses the final discrete source and the final second TCC operator to determine a projected image of the first layout pattern of the photo mask on a wafer.

2. The method of claim 1, wherein the first layout pattern of the photo mask comprises one or more specific features, and wherein using the final discrete source and the final second TCC operator to determine the projected image of the first layout pattern generates the one or more specific features on a resist layer on the wafer.

3. The method of claim 2, wherein the specific features comprise one or more of a curvature, a vertical line, or a horizontal line.

4. The method of claim 1, further comprising:
   receiving an illumination profile of the illumination source and sampling the illumination profile of the illumination source at a number of locations equal to the first number of sampling points.

5. The method of claim 4, wherein the sampling the illumination source is a non-uniform sampling and the re-sampling the illumination source is a uniform sampling.

6. The method of claim 4, wherein the illumination profile is one of an amplitude profile or an intensity profile of the illumination source.

7. The method of claim 1, further comprising:
   producing the OPC corrected first layout pattern on a mask-blank to create a photo mask.

8. A method comprising:
   determining a first transmission cross coefficient (TCC) operator of an optical system of a lithographic system based on an illumination source of the optical system and an exit pupil of the optical system of the lithographic system;
   sampling the illumination source of the optical system by a first number of sampling points at a first number of sampling locations to make a first discrete source;
   determining a second TCC operator of the optical system of the lithographic system based on the first discrete source and the exit pupil of the optical system;
   determining an error between the first TCC operator and the second TCC operator;
   recursively adjusting the first number of sampling points and the first number of sampling locations to re-sample the illumination source and to re-determine the second TCC operator based on the re-sampled illumination source until the error is within a threshold error range and a final discrete source and a final second TCC operator is determined, wherein the threshold error range has an upper limit and a lower limit;
   performing an inverse lithographic transformation (ILT) operation of a first layout pattern of a photo mask, wherein the ILT operation uses the final discrete source and the final second TCC operator to determine a projected image of the first layout pattern of the photo mask on a wafer for determining an ILT enhancement of the first layout pattern; and
   producing the ILT enhanced first layout pattern on a mask-blank to create a photo mask.

9. The method of claim 8, wherein the error is above the upper limit of the threshold error range, and wherein the re-sampling the illumination source comprises:
   increasing the first number of sampling points to a second number of sampling points;
   uniformly sampling the illumination source with the second number of sampling points; and
   recursively adjusting sampling locations of the second number of sampling points to re-sample the illumination source and to re-determine the second TCC operator based on the re-sampled illumination source until the error is minimized.

10. The method of claim 8, wherein the error is below the lower limit of the threshold error range, and wherein the re-sampling the illumination source comprises:
   decreasing the first number of sampling points to a second number of sampling points;
   uniformly sampling the illumination source with the second number of sampling points; and recursively adjusting sampling locations of the second number of sampling points to re-sample the illumination source and to re-determine the second TCC operator based on the re-sampled illumination source until the error is minimized.

11. The method of claim 8, further comprising:
representing the final second TCC operator by a weighted sum of a plurality of kernels in a kernel space;
approximating the final second TCC operator by a weighted sum of two or more kernels of the plurality of kernels; and
using the approximated final second TCC operator and the first discrete source to determine the projected image of the first layout pattern of the photo mask on the wafer.

12. The method of claim 8, wherein the first TCC operator and the second TCC operator are respectively discretized to generate a first TCC matrix and a second TCC matrix, the method further comprising:
determining the error by determining a Frobenius-norm error between the first TCC matrix and the second TCC matrix.

13. The method of claim 8, further comprising:
prior to the performing the ILT operation of the first layout pattern:
performing an optical proximity correction (OPC) operation of the first layout pattern, wherein the ILT operation uses the final discrete source and the final second TCC operator to determine a projected image of the first layout pattern of the photo mask on the wafer; and
performing the ILT operation of the OPC corrected first layout pattern using the final discrete source and the final second TCC operator to determine the projected image of the OPC corrected first layout pattern of the photo mask on the wafer.

14. The method of claim 8, further comprising:
receiving a second layout pattern, different from the first layout pattern, of the photo mask of the lithographic system; and
performing the ILT of the second layout pattern using the final discrete source and the final second TCC operator to determine a projected image of the second layout pattern of the photo mask on the wafer.

15. A lithographic system, comprising:
a main controller;
a photo mask;
a mask enhancer coupled to the main controller;
an optical system comprising an illumination source and coupled to the main controller;
a mask projector coupled to the main controller and the mask enhancer and configured to produce a projection of the photo mask on a wafer;
an analyzer module coupled to the main controller, wherein the analyzer module is configured to receive a first layout pattern of the photo mask to be produced on the wafer;
the mask enhancer is coupled to the analyzer module through the main controller and is configured to receive the first layout pattern from the analyzer module and to perform one of an optical proximity correction (OPC) operation or an inverse lithographic transformation (ILT) operation of the first layout pattern;
the mask enhancer is further configured to determine a final discrete source and a final second TCC operator by:
receiving a first number of sampling points from the analyzer module;
determining a first transmission cross coefficient (TCC) operator of the optical system of the lithographic system based on the illumination source of the optical system and an exit pupil of the optical system;
sampling the illumination source of the optical system by the first number of sampling points to make a first discrete source;
determining a second TCC operator of the optical system of the lithographic system based on the first discrete source and the exit pupil of the optical system;
determining an error between the first TCC operator and the second TCC operator;
recursively adjusting the first number of sampling points to re-sample the illumination source and re-determining the second TCC operator based on the re-sampled illumination source until the error is below a threshold level and a final discrete source and a final second TCC operator is determined; and
wherein the mask projector is configured to perform the projection of the photo mask on the wafer for the OPC operation or the ILT operation using the final discrete source and the final second TCC operator to determine a projected image of the first layout pattern of the photo mask on the wafer.

16. The lithographic system of claim 15, wherein the illumination source is a laser source.

17. The lithographic system of claim 15, wherein the illumination source is one of a coherent source or a partially coherent source.

18. The lithographic system of claim 15, wherein a profile of the illumination source is either:
a circular profile having a radius between 1 cm and 20 cm and having a constant amplitude; or
a Gaussian profile with a standard deviation between 1 cm and 20 cm.

19. The lithographic system of claim 18, wherein:
the illumination source of the optical system is a polarized illumination source with two time varying electric or magnetic components in a first direction and in a second direction perpendicular to the first direction;
the first and second directions are perpendicular to a direction of travel of a beam of the polarized illumination source;
the analyzer module is further configured to determine a first variance profile of the component in the first direction, a second variance profile of the component is the second direction, and a covariance profile between the components of the first and second directions of the polarized illumination source;
the mask enhancer is further configured to:
assign one of the first variance profile, the second variance profile, or the covariance profile to the profile of the illumination source,
determine a final discrete profile of the assigned first variance profile, second variance profile, or the covariance profile, and
determine a final second TCC operator of the assigned first variance profile, second variance profile, or the covariance profile; and
the mask projector is also configured to perform a projection of the first layout pattern of the photo mask by the assigned profile of the polarized illumination source on the wafer for the OPC operation or the ILT operation using the determined final discrete profile and the final second TCC operator.

20. The lithographic system of claim 15, wherein the illumination source is one of a deep ultraviolet or an extreme ultraviolet illumination source.

* * * * *